United States Patent
Hong

(10) Patent No.: US 10,755,785 B2
(45) Date of Patent: Aug. 25, 2020

(54) MEMORY SYSTEM AND METHOD OF OPERATING THE SAME

(71) Applicant: SK hynix Inc., Gyeonggi-do (KR)

(72) Inventor: Ji Man Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 115 days.

(21) Appl. No.: 16/055,793

(22) Filed: Aug. 6, 2018

(65) Prior Publication Data

US 2019/0189217 A1    Jun. 20, 2019

(30) Foreign Application Priority Data

Dec. 20, 2017    (KR) .................. 10-2017-0176580

(51) Int. Cl.

| | | |
|---|---|---|
| *G11C 16/10* | (2006.01) | |
| *G11C 11/56* | (2006.01) | |
| *G11C 11/4093* | (2006.01) | |
| *G11C 16/34* | (2006.01) | |
| *G11C 7/02* | (2006.01) | |
| *G11C 29/02* | (2006.01) | |
| *G11C 29/42* | (2006.01) | |
| *G11C 16/04* | (2006.01) | |
| *G11C 16/26* | (2006.01) | |
| *G11C 29/04* | (2006.01) | |

(52) U.S. Cl.
CPC ............... *G11C 16/10* (2013.01); *G11C 7/02* (2013.01); *G11C 11/4093* (2013.01); *G11C 11/5628* (2013.01); *G11C 16/3404* (2013.01); *G11C 16/3427* (2013.01); *G11C 16/3454* (2013.01); *G11C 29/021* (2013.01); *G11C 29/028* (2013.01); *G11C 16/0483* (2013.01); *G11C 16/26* (2013.01); *G11C 29/42* (2013.01); *G11C 2029/0409* (2013.01); *G11C 2029/0411* (2013.01); *G11C 2207/2236* (2013.01)

(58) Field of Classification Search
CPC . G11C 16/10; G11C 16/3404; G11C 16/3427; G11C 16/06; G11C 7/02; G11C 11/4093; G11C 11/5628; G11C 29/021; G11C 29/028; G11C 29/42
USPC .................................................... 365/185.24
See application file for complete search history.

(56) References Cited

U.S. PATENT DOCUMENTS

| | | | |
|---|---|---|---|
| 8,839,071 B2 * | 9/2014 | Jo ....................... | G11C 16/3404 714/763 |
| 9,058,878 B2 * | 6/2015 | Aritome .............. | G11C 11/5642 |
| 10,199,111 B1 * | 2/2019 | Besinga ............... | G11C 29/028 |
| 2007/0234183 A1 * | 10/2007 | Hwang .................. | G11C 29/42 714/763 |

(Continued)

FOREIGN PATENT DOCUMENTS

| | | |
|---|---|---|
| KR | 101075505 | 10/2011 |
| KR | 1020130085154 | 7/2013 |

*Primary Examiner* — Sung Il Cho
(74) *Attorney, Agent, or Firm* — IP & T Group LLP

(57) ABSTRACT

A memory system may include performing a first read operation on first data stored in first memory cells coupled to a first word line, performing an error correction operation on the first data, performing an interference program operation on second memory cells coupled to a second word line when the error correction operation fails, and performing a second read operation on the first data stored in the first memory cells after performing the interference program operation.

20 Claims, 15 Drawing Sheets

(56) References Cited

U.S. PATENT DOCUMENTS

2008/0205136 A1* 8/2008 Wang .................. G06F 11/1072
365/185.03
2019/0295651 A1* 9/2019 Shim .................. G11C 11/4094

* cited by examiner

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2017-0176580 filed on Dec. 20, 2017, which is incorporated herein by reference in its entirety.

BACKGROUND

1. Field of Invention

Various embodiments of the present disclosure generally relate to a memory system and a method of operating the memory system. Particularly, the embodiments relate to a memory system that performs an interference program operation on adjacent memory cells to improve a threshold voltage distribution of memory cells, and to a method of operating the memory system.

2. Description of the Related Art

Semiconductor memory devices may be classified into a volatile semiconductor memory device and a nonvolatile semiconductor memory device. A volatile semiconductor memory device is advantageous in that reading and writing may be performed at high speeds, but is disadvantageous in that information stored therein is lost when the power supply is interrupted. In contrast, a nonvolatile semiconductor memory device may retain information stored therein even when the power supply is interrupted. Therefore, a nonvolatile semiconductor memory device is used to store information that needs to be retained regardless of whether power is supplied.

Examples of a nonvolatile semiconductor memory device may include a mask read-only memory (MROM), a programmable read-only memory (PROM), an erasable programmable read-only memory (EPROM), an electrically erasable programmable read-only memory (EEPROM), and the like.

A representative example of a nonvolatile semiconductor memory device is a flash memory device. A flash memory device has been widely used as an audio and video data storage medium for electronic devices, such as a computer, a mobile phone, a personal digital assistant (PDA), a digital camera, a camcorder, a voice recorder, an MP3 player, a handheld personal computer (PC), a game console, a facsimile, a scanner, and a printer.

Recently, as demand for high integration of memory devices has increased, multi-bit flash memory devices in which multiple bits are stored in a single memory cell have become popular.

A memory device may include a plurality of memory cells coupled to a single word line, and may perform a program operation which stores data in memory cells and an erase operation which erases programmed data.

SUMMARY

Various embodiments of the present disclosure are directed to a memory system, which can improve reliability thereof, and a method of operating such memory system.

An embodiment of the present disclosure may provide for a method of operating a memory system. The method may include performing a first read operation on first data stored in first memory cells coupled to a first word line, performing an error correction operation on the first data, performing an interference program operation on second memory cells coupled to a second word line when the error correction operation fails, and performing a second read operation on the first data stored in the first memory cells after performing the interference program operation.

An embodiment of the present disclosure may provide for a method of operating a memory device. The method may include performing a first read operation on first data stored in first memory cells coupled to a first word line, performing a read operation on second data stored in second memory cells coupled to a second word line that is adjacent to the first word line, performing an interference program operation on the second memory cells, and performing a second read operation on the first data stored in the first memory cells after performing the interference program operation, wherein the interference program operation causes widths of one or more of program threshold voltage distributions formed by the first memory cells to decrease.

An embodiment of the present disclosure may provide for a memory system. The memory system may include a first physical page configured to store data, a second physical page arranged adjacent to the first physical page, a control logic configured to control a read operation and a program operation on the first and second physical pages, and an error checking and correction unit configured to perform an error correction operation on data read from the first and second physical pages, wherein, when the error checking and correction unit fails in an error correction operation performed on data read from the first physical page, the control logic performs a program operation on the second physical page.

An embodiment of the present disclosure may provide for a memory system. The memory system comprises a memory device and a controller configured to control the memory device to perform an interference program operation on second multi-level cells coupled to a second word line when a read operation fails to first multi-level cells coupled to a first word line adjacent to the second word line and to perform another read operation to the first multi-level cells, wherein the controller controls, during the interference program operation, the memory device to back up data stored in the second multi-level cells, increase threshold voltages of the second multi-level cells of an erase threshold voltage distribution by a first amount, increase threshold voltages of the second multi-level cells of a second program threshold voltage distribution by a second amount and increase threshold voltages of the second multi-level cells of a third program threshold voltage distribution by a third amount, wherein the threshold voltages of the erase threshold voltage distribution are less than the threshold voltages of the second program threshold voltage distribution, which are less than the threshold voltages of the third program threshold voltage distribution, and wherein the first amount is greater than the second amount, which is greater than the third amount.

DETAILED DESCRIPTION

Advantages and features of the present disclosure, and methods for achieving the same will become clear in connection with embodiments described in detail below with reference to the accompanying drawings. However, the present disclosure is not limited to the following embodiments but embodied in other forms. The disclosed embodiments are provided so that the present disclosure is thorough and complete and fully conveys the technical spirit of the disclosure to those skilled in the art. It is further noted that reference to "an embodiment" is not necessarily to only one embodiment, and different references to "an embodiment" are not necessarily to the same embodiment(s).

It is also noted that in this specification, "connected/coupled" refers to one component not only directly coupling another component but also indirectly coupling another component through one or more intermediate components. In the specification, when an element is referred to as "comprising" or "including" a component, that does not preclude another unstated component from being included, unless the context clearly indicates otherwise.

Figure 1:
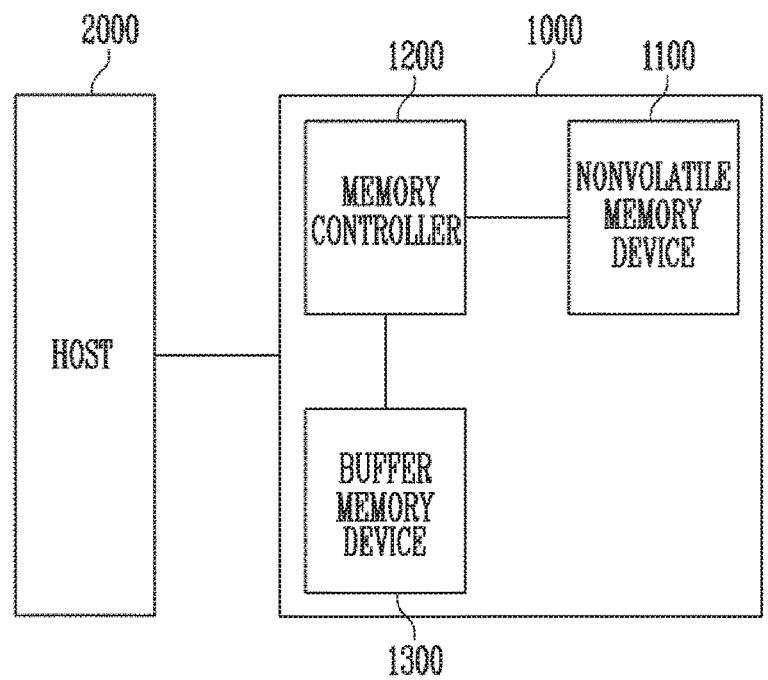
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a nonvolatile memory device 1100 in which data stored therein is retained even if the supply of power is interrupted, a buffer memory device 1300 which temporarily stores data, and a memory controller 1200 which controls the nonvolatile memory device 1100 and the buffer memory device 1300 under the control of a host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (e MC), Dual In-line Memory Module (DIMM), Registered DIMM (RDIMM), and Load Reduced DIMM (LRDIMM) communication methods.

The memory controller 1200 may control the overall operation of the memory system 1000, and may control data exchange between the host 2000 and the nonvolatile memory device 1100. For example, the memory controller 1200 may program or read data by controlling the nonvolatile memory device 1100 in response to a request received from the host 2000. Further, the memory controller 1200 may store information about main memory blocks and sub-memory blocks included in the nonvolatile memory device 1100, and may select the nonvolatile memory device 1100 so that a program operation is performed on a main memory block or a sub-memory block depending on the amount of data loaded for the program operation. In an embodiment, the nonvolatile memory device 1100 may include a flash memory.

The memory controller 1200 may control data exchange between the host 2000 and the buffer memory device 1300 or may temporarily store system data for controlling the nonvolatile memory device 1100 in the buffer memory device 1300. The buffer memory device 1300 may be used as a working memory, a cache memory, or a buffer memory of the memory controller 1200. The buffer memory device 1300 may store codes and commands that are executed by the memory controller 1200. Further, the buffer memory device 1300 may store data that is processed by the memory controller 1200.

The memory controller 1200 may temporarily store data, received from the host 2000, in the buffer memory device 1300, and then transmit the data, temporarily stored in the buffer memory device 1300, to the nonvolatile memory device 1100, after which the transmitted data is stored in the nonvolatile memory device 1100. Also, the memory controller 1200 may receive data and a logical address from the host 2000, and may translate the logical address into a physical address indicating the area of the nonvolatile memory device 1100 in which the data is to be actually stored. Further, the memory controller 1200 may store a logical-physical address mapping table, which configures mapping relationships between logical addresses and physical addresses, in the buffer memory device 1300.

In an embodiment, the buffer memory device 1300 may include a double data rate synchronous dynamic random access memory (DDR SDRAM), a double data rate fourth generation (DDR4) SDRAM, a low power double data rate fourth generation (LPDDR4) SDRAM, a graphics double data rate (GDDR) SDRAM, a low power DDR (LPDDR) SDRAM, or a Rambus DRAM (RDRAM).

Although FIG. 1 shows that the buffer memory device 1300 is included in the memory system 1000, the present disclosure is not limited thereto. That is, the memory system 1000 may not include the buffer memory device 1300, which may be provided separately.

Figure 2:
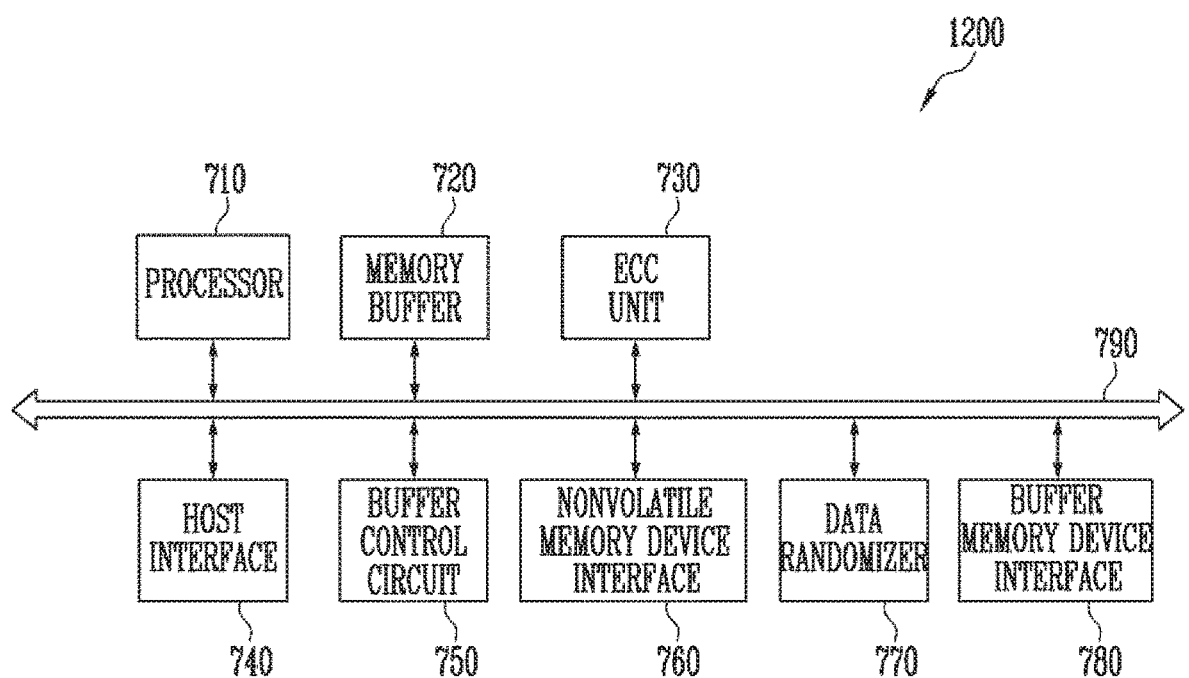
FIG. 2 is a diagram illustrating a memory controller of FIG. 1.

FIG. 2 is a diagram illustrating the memory controller 1200 of FIG. 1.

Referring to FIG. 2, the memory controller 1200 may include a processor 710, a memory buffer 720, an error checking and correction (ECC) unit 730, a host interface 740, a buffer control circuit 750, a nonvolatile memory device interface 760, a data randomizer 770, a buffer memory device interface 780, and a bus 790.

The bus 790 may provide a channel between components of the memory controller 1200.

The processor 710 may control the overall operation of the memory controller 1200 and perform a logical operation. The processor 710 may communicate with an external host 2000 through the host interface 740, and may communicate with a nonvolatile memory device 1100 through the nonvolatile memory device interface 760. Further, the processor 710 may communicate with a buffer memory device 1300 through the buffer memory device interface 780. Furthermore, the processor 710 may control the memory buffer 720 through the buffer control circuit 750. The processor 710 may control the operation of the memory system 1000 by using the memory buffer 720 as a working memory, a cache memory or a buffer memory.

The processor 710 may queue a plurality of commands inputted from the host 2000. This operation is called a multi-queue operation. The processor 710 may sequentially transfer a plurality of queued commands to the nonvolatile memory device 1100.

The memory buffer 720 may be used as a working memory, a cache memory, or a buffer memory of the processor 710. The memory buffer 720 may store codes and commands that are executed by the processor 710. The memory buffer 720 may store data that is processed by the processor 710. The memory buffer 720 may include a static RAM (SRAM) or a dynamic RAM (DRAM).

The ECC unit 730 may perform error checking and correction. The ECC unit 730 may perform Error Correction Code (ECC) encoding based on data to be written to the nonvolatile memory device 1100 through the nonvolatile memory device interface 760. The ECC-encoded data may be transferred to the nonvolatile memory device 1100 through the nonvolatile memory device interface 760. The ECC unit 730 may perform ECC decoding on data received from the nonvolatile memory device 1100 through the nonvolatile memory device interface 760. In an embodiment, the ECC unit 730 may be included as part of the nonvolatile memory device interface 760.

The host interface 740 may communicate with the external host device 2000 under the control of the processor 710. The host interface 740 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-Volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 750 may control the memory buffer 720 under the control of the processor 710.

The nonvolatile memory device interface 760 may communicate with the nonvolatile memory device 1100 under the control of the processor 710. The nonvolatile memory device interface 760 may transmit/receive commands, addresses, and data to/from the nonvolatile memory device 1100 through a channel.

Although FIG. 2 shows the memory buffer 720 and the buffer control circuit 750 included in the memory controller 1200, the present disclosure is not limited thereto. That is, the memory controller 1200 may not include one or both of the memory buffer 720 and the buffer control circuit 750. The memory buffer 720 and/or the buffer control circuit 750 may be provided separately.

In an embodiment, the processor 710 may control the operation of the memory controller 1200 using codes. The processor 710 may load codes from a nonvolatile memory device (e.g., ROM) provided in the memory controller 1200. In an embodiment, the processor 710 may load codes from the nonvolatile memory device 1100 through the nonvolatile memory device interface 760.

The data randomizer 770 may randomize data or derandomize the randomized data. The data randomizer 770 may perform a data randomize operation on data to be written to the nonvolatile memory device 1100 through the nonvolatile memory device interface 760. The randomized data may be transferred to the nonvolatile memory device 1100 through the nonvolatile memory device interface 760. The data randomizer 770 may perform a data derandomize operation on data received from the nonvolatile memory device 1100 through the nonvolatile memory device interface 760. In an embodiment, the data randomizer 770 may be included as the component of the nonvolatile memory device interface 760.

In an embodiment, the bus 790 of the memory controller 1200 may be divided into a control bus and a data bus. The data bus may transmit data in the memory controller 1200, and the control bus may transmit control information such as commands or addresses in the memory controller 1200. The data bus and the control bus may be separated from each other, and may neither interfere with nor influence each other. The data bus may be coupled to the host interface 740, the buffer control circuit 750, the ECC unit 730, the nonvolatile memory device interface 760, and the buffer memory device interface 780. The control bus may be coupled to the host interface 740, the processor 710, the buffer control circuit 750, the nonvolatile memory device interface 760, and the buffer memory device interface 780. Although FIG. 2 shows the buffer memory device interface 780 included in the memory controller 1200, the present disclosure is not limited thereto. That is, the memory controller 1200 may not include the buffer memory device interface 780, which may be provided separately.

The buffer memory device interface 780 may communicate with the buffer memory device 1300 under the control of the processor 710. The buffer memory device interface 780 may transmit/receive commands, addresses, and data to/from the buffer memory device 1300 through a channel.

Figure 3:
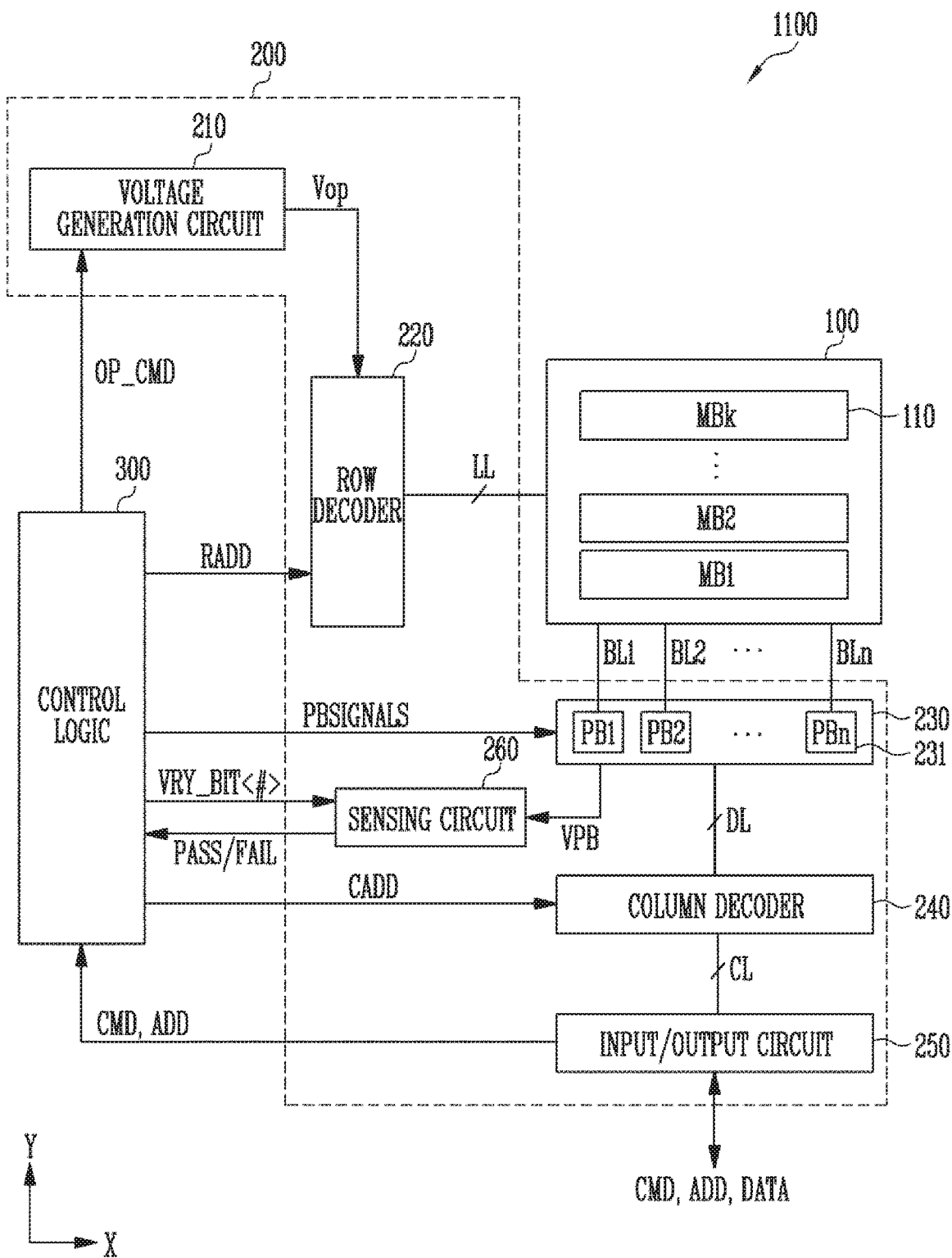
FIG. 3 is a diagram illustrating a memory device of FIG. 1.

FIG. 3 is a diagram illustrating the nonvolatile memory device 1100 of FIG. 1.

Referring to FIG. 3, the nonvolatile memory device 1100 may include a memory cell array 100 in which data is stored. The nonvolatile memory device 1100 may also include peripheral circuits 200, which perform a program operation for storing data in the memory cell array 100, a read operation for outputting stored data, and an erase operation for erasing stored data. The nonvolatile memory device 1100 may include a control logic 300, which controls the peripheral circuits 200 under the control of a memory controller (e.g., 1200 of FIG. 1).

The memory cell array 100 may include a plurality of memory blocks MB1 to MBk 110 (where k is a positive integer). Local lines LL and bit lines BL1 to BLn (where n is a positive integer) may be coupled to each of the memory blocks MB1 to MBk 110. For example, the local lines LL may include a first select line, a second select line, and a plurality of word lines arranged between the first and second select lines. Further, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipelines. The local lines LL may be coupled to the memory blocks MB1 to MBk 110, respectively, and the bit lines BL1 to BLn may be coupled in common to the memory blocks MB1 to MBk 110. The memory blocks MB1 to MBk 110 may be implemented as a two-dimensional (2D) or a three-dimensional (3D) structure. For example, the memory cells in the memory blocks 110 having a 2D structure may be arranged horizontally on a substrate. For example, memory cells in the memory blocks 110 having a 3D structure may be stacked vertically on the substrate.

The peripheral circuits 200 may be configured to perform a program, read or erase operation on a selected memory block 110 under the control of the control logic 300. For example, the peripheral circuits 200 may supply a verify voltage and pass voltages to the first select line, the second select line, and the word lines, may selectively discharge the first select line, the second select line, and the word lines, and may verify memory cells coupled to a word line selected from among the word lines, under the control of the control logic 300. For example, the peripheral circuits 200 may include a voltage generation circuit 210, a row decoder 220, a page buffer group 230, a column decoder 240, an input/output circuit 250, and a sensing circuit 260.

The voltage generation circuit 210 may generate various operation voltages flop used for program, read and erase operations in response to an operation signal OP_CMD. Further, the voltage generation circuit 210 may selectively discharge the local lines LL in response to the operation signal OP_CMD, For example, the voltage generation circuit 210 may generate a program voltage, a verify voltage, pass voltages, a turn-on voltage, a read voltage, an erase voltage, a source line voltage, etc. under the control of the control logic 300.

The row decoder 220 may transfer the operation voltages flop to the local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn or may sense the voltages or currents of the bit lines BL1 to BLn during a read or a verify operation.

The column decoder 240 may transfer data between the input/output circuit 250 and the page buffer group 230 in response to a column address CAN), For example, the column decoder 240 may exchange data with the page buffers 231 through data lines DL or may exchange data with the input/output circuit 250 through column lines CL.

The input/output circuit 250 may transmit a command CMD and an address ADD, received from the memory controller (e.g., 1200 of FIG. 1), to the control logic 300, or may exchange data DATA with the column decoder 240.

The sensing circuit 260 may generate a reference current in response to an enable bit VRY_BIT<#> and may output a pass signal PASS or a fail signal FAIL by comparing a sensing voltage VPB, received from the page buffer group 230, with a reference voltage, generated based on the reference current, during the read operation or the verify operation.

The control logic 300 may control the peripheral circuits 200 by outputting the operation signal OP_CMD, the row address RADD, the page buffer control signals PBSIGNALS, and the enable bit VRY_BIT<#> in response to the command CMD and the address ADD. Further, the control logic 300 may determine whether a verify operation has passed or failed in response to a pass or fail signal PASS or FAIL.

Figure 4:
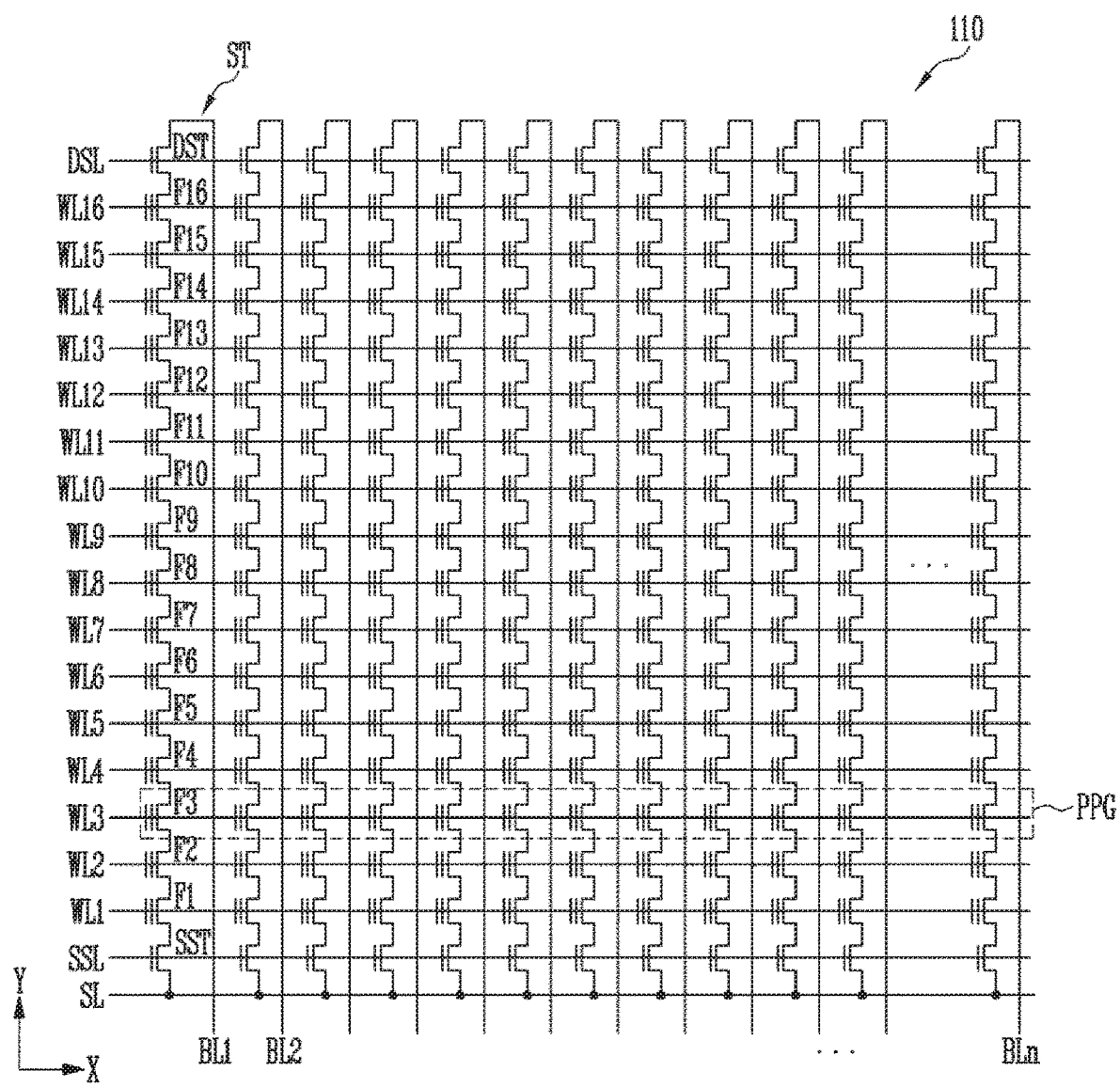
FIG. 4 is a diagram illustrating a memory block of FIG. 3.

FIG. 4 is a diagram illustrating the memory block 110 of FIG. 3.

Referring to FIG. 4, the memory block 110 may be configured such that a plurality of word lines, which are arranged in parallel, are coupled between a first select line and a second select line. Here, the first select line may be a source select line SSL and the second select line may be a drain select line DSL. In detail, the memory block 110 may include a plurality of strings ST coupled between bit lines BL1 to BLn and a source line SL. The bit lines BL1 to BLn may be respectively coupled to the strings ST, and the source line may be coupled in common to the strings ST. Since the strings ST may have the same configuration, a string ST coupled to the first bit line BL1 will be described in detail by way of example.

The string ST may include a source select transistor SST, a plurality of memory cells F1 to F16, and a drain select transistor DST, which are connected in series between the source line SL and the first bit line BL1. A single string ST may include one or more source select transistors SST and drain select transistors DST, and may include more memory cells than the memory cells F1 to F16 illustrated in the drawing.

A source of the source select transistor SST may be coupled to the source line SL and a drain of the drain select transistor DST may be coupled to the first bit line BL1. The memory cells F1 to F16 may be connected in series between the source select transistor SST and the drain select transistor DST. Gates of the source select transistors SST included in different strings ST may be coupled to a source select line SSL, gates of the drain select transistors DST may be coupled to a drain select line DSL, and gates of the memory cells F1 to F16 may be coupled to a plurality of word lines WL1 to WL16. A group of memory cells coupled to the same word line, among the memory cells included in different strings ST, may be referred to as a physical page PPG. Therefore, a number of physical pages PPG that are identical to the number of word lines WL1 to WL16 may be included in the memory block 110.

One memory cell (MC) may store one bit of data. This is typically referred to as a single-level cell (SLC). In this case, one physical page PPG may store data corresponding to one logical page LPG. The data corresponding to one logical page LPG may include a number of data bits identical to the number of cells included in one physical page PPG. Further, one memory cell (MC) may include two or more bits of data. This cell is typically referred to as a multi-level cell (MLC).

Here, one physical page PPG may store data corresponding to two or more logical pages LPG.

Figure 5:
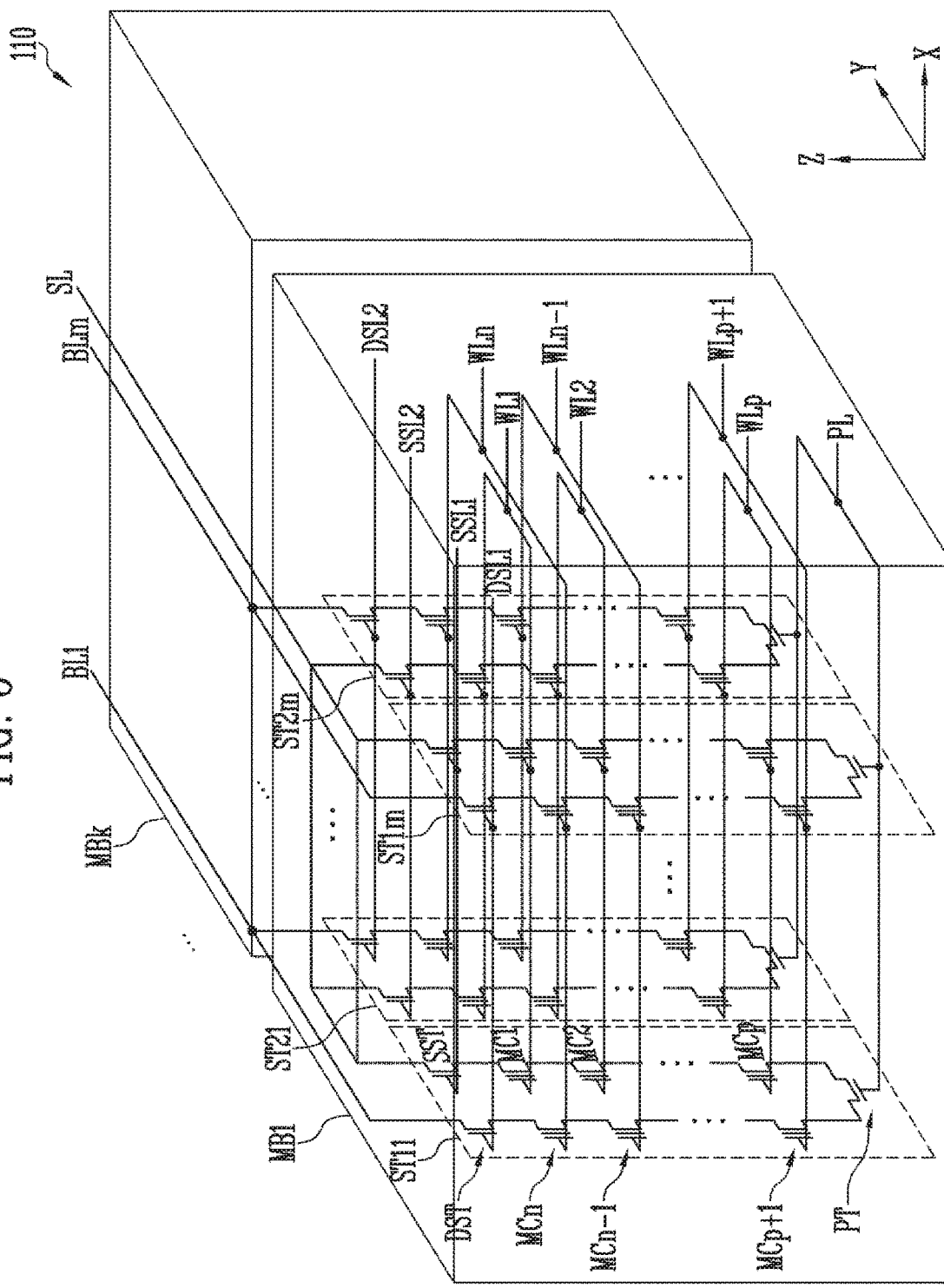
FIG. 5 is a diagram illustrating an example of a memory block having a three-dimensional (3D) structure.

FIG. 5 is a diagram illustrating an example of a memory block having a three-dimensional (3D) structure.

Referring to FIG. 5, a memory cell array 100 may include a plurality of memory blocks MB1 to MBk 110. Each of the memory blocks 110 may include a plurality of strings ST11 to ST1m and ST21 to ST2m. In an embodiment, each of the strings ST11 to ST1m and ST21 to ST2m may be formed in a 'U' shape. In the first memory block MB1, m strings may be arranged in a row direction (e.g., X direction). Although, in FIG. 5, two strings are illustrated as being arranged in a column direction (e.g., Y direction), this is given for clarity of illustration; three or more strings may be arranged in the column direction (e.g., Y direction).

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. For example, a pillar for providing at least one of the channel layer, the tunnel insulating layer, the charge trap layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 5, the source select transistors of the strings ST11 to ST1m in a first row may be coupled to a first source select line SSL1. The source select transistors of the strings ST21 to ST2m in a second row may be coupled to a second source select line SSL2.

In other embodiments, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The memory cells MC1 to MCp may be sequentially arranged in a vertical direction Z direction), and may be coupled in series between the source select transistor SST and the pipe transistor PT. The memory cells MCp+1 to MCn may be sequentially arranged in the vertical direction (e.g., Z direction), and may be coupled in series between the pipe transistor PT and the drain select transistor DST. The memory cells MC1 to MCp and the memory cells MCp+1 to MCn may be coupled to each other through the pipe transistor PT. Gates of the memory cells MC1 to MCn of each string may be coupled to first to n-th word lines WL1 to WLn, respectively.

In an embodiment, at least one of the memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1m in the first row may be coupled to a drain select line DSL1. The drain select transistors of the strings ST21 to ST2m in the second row may be coupled to a second drain select line DSL2.

The strings arranged in the column direction may be coupled to bit lines extending in the column direction. In FIG. 5, the strings ST11 and ST21 in a first column may be coupled to a first bit line BL1. The strings ST1m and ST2m in an m-th column may be coupled to an m-th bit line BLm.

Among strings arranged in the row direction, memory cells coupled to the same word line may constitute one page. For example, memory cells coupled to the first word line WL1, among the strings ST11 to ST1m in the first row, may constitute one page. Among the strings ST21 to ST2m in the second row, memory cells coupled to the first word line WL1 may constitute one additional page. Strings arranged in the direction of a single row may be selected by selecting any one of the drain select lines DSL1 and DSL2. One page may be selected from the selected strings by selecting any one of the word lines WL1 to WLn.

Figure 6:
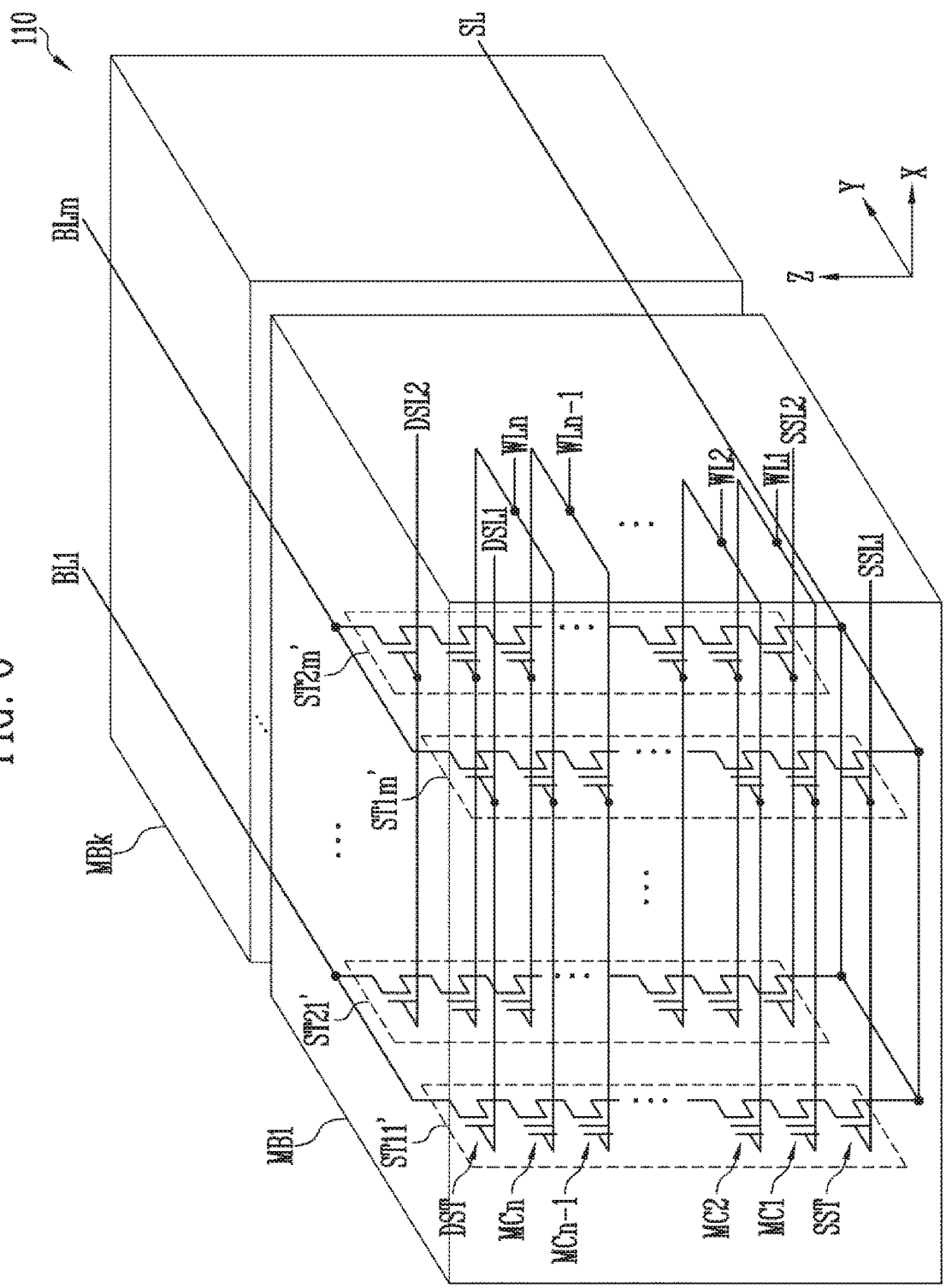
FIG. 6 is a diagram illustrating an example of a memory block having a 3D structure.

FIG. 6 is a diagram illustrating an example of a memory block 110 having a 3D structure.

Referring to FIG. 6, a memory cell array 100 may include a plurality of memory blocks MB1 to MBk 110. Each of the memory blocks 110 may include a plurality of strings ST11' to ST1m' and ST21' to ST2m'. Each of the strings ST11' to ST1m' and ST21' to ST2m' may extend along a vertical direction (e.g., Z direction). In the memory block 110, strings may be arranged in a row direction (e.g., X direction). Although, in FIG. 6, two strings are illustrated as being arranged in a column direction (e.g., Y direction), this is given for clarity of illustration; three or more strings may be arranged in the column direction (e.g., Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the memory cells MC1 to MCn may be used as a dummy memory cell. When the dummy memory cell is provided, the voltage or current of the corresponding string may be stably controlled. Thereby, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

That is, the memory block 110 of FIG. 6 may have a circuit similar to that of the memory block 110 of FIG. 5, except that a pipe transistor PT is excluded from each string.

Figure 7:
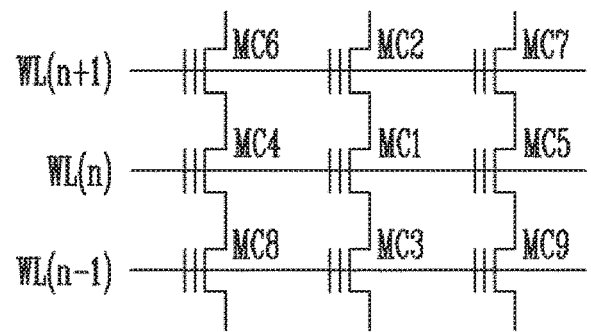
FIG. 7 is a diagram explaining an interference phenomenon between adjacent memory cells.

FIG. 7 is a diagram explaining an interference phenomenon between adjacent memory cells.

Referring to FIG. 7, a memory block 110 may include first to ninth memory cells MC1 to MC9. The second memory cell MC2 coupled to word line WL(n+1) and the third memory cell MC3 coupled to word line WL(n−1) may be adjacent to the first memory cell MC1 coupled to word line WL(n). Further, the fourth memory cell MC4 and the fifth memory cell MC5 may be adjacent to the first memory cell MC1. Furthermore, the sixth memory MC6, the seventh memory cell MC7, the eighth memory cell MC8, and the ninth memory cell MC9 may be adjacent to the first memory cell MC1. Thus, for any memory cell, adjacent memory cells may be located along a word line direction, a bit line direction, and diagonal directions.

In an embodiment, when the threshold voltage of the first memory cell MC1 changes, the threshold voltages of the second to ninth memory cells MC2 to MC9 adjacent to the first memory cell MC1 may change due to the change in the threshold voltage of the first memory cell MC1.

In other words, when the threshold voltage of the first memory cell MC1 is increased by a first threshold voltage Vth1, the threshold voltages of the second and third memory cells MC2 and MC3 adjacent to the first memory cell MC1 in the direction of word lines may be increased by a second threshold voltage Vth2, and the threshold voltages of the fourth and fifth memory cells MC4 and MC5 may be increased by a third threshold voltage Vth3. Further, the threshold voltages of the sixth to ninth memory cells MC6 to MC9 may be increased by a fourth threshold voltage Vth4.

Relationships among the first to fourth threshold voltages Vth1 to Vth4 may be as provided in equation 1:

$$Vth1 > Vth2 > Vth3 > Vth4 \text{ or } Vth1 > Vth3 > Vth2 > Vth4. \quad \text{[Equation 1]}$$

As the threshold voltage of a memory cell changes, the threshold voltages of adjacent memory cells may proportionally change. In other words, in the above-described example, as the first threshold voltage Vth1 is increased, the second threshold voltage Vth2, the third threshold voltage Vth3, and the fourth threshold voltage Vth4 may also be increased in proportion to the increase of the first threshold voltage.

The changes in the threshold voltages of adjacent memory cells attributable to the change in the threshold voltage of the corresponding memory cell may appear even when the threshold voltage of the corresponding memory cell is decreased.

The above-described changes in the threshold voltages of adjacent memory cells attributable to the change in the threshold voltage of the memory cell may be a phenomenon occurring due to capacitance coupling between memory cells. In an embodiment, when the memory cell includes a floating gate, a change in the threshold voltage of the memory cell may result from a change in the number of electrons in the floating gate, which change may change the potential of the floating gate. The change in the potential of the floating gate of the memory cell may change the potential of the floating gates of adjacent memory cells due to capacitance coupling, thus resulting in changes in the threshold voltages of the adjacent memory cells. This phenomenon may be referred to as "floating gate coupling."

Such floating gate coupling may be further intensified as a memory cell manufacturing process is refined. Therefore, as the memory cell manufacturing process is refined, there may be an increased need for technology capable of compensating for floating gate coupling.

Figure 8:
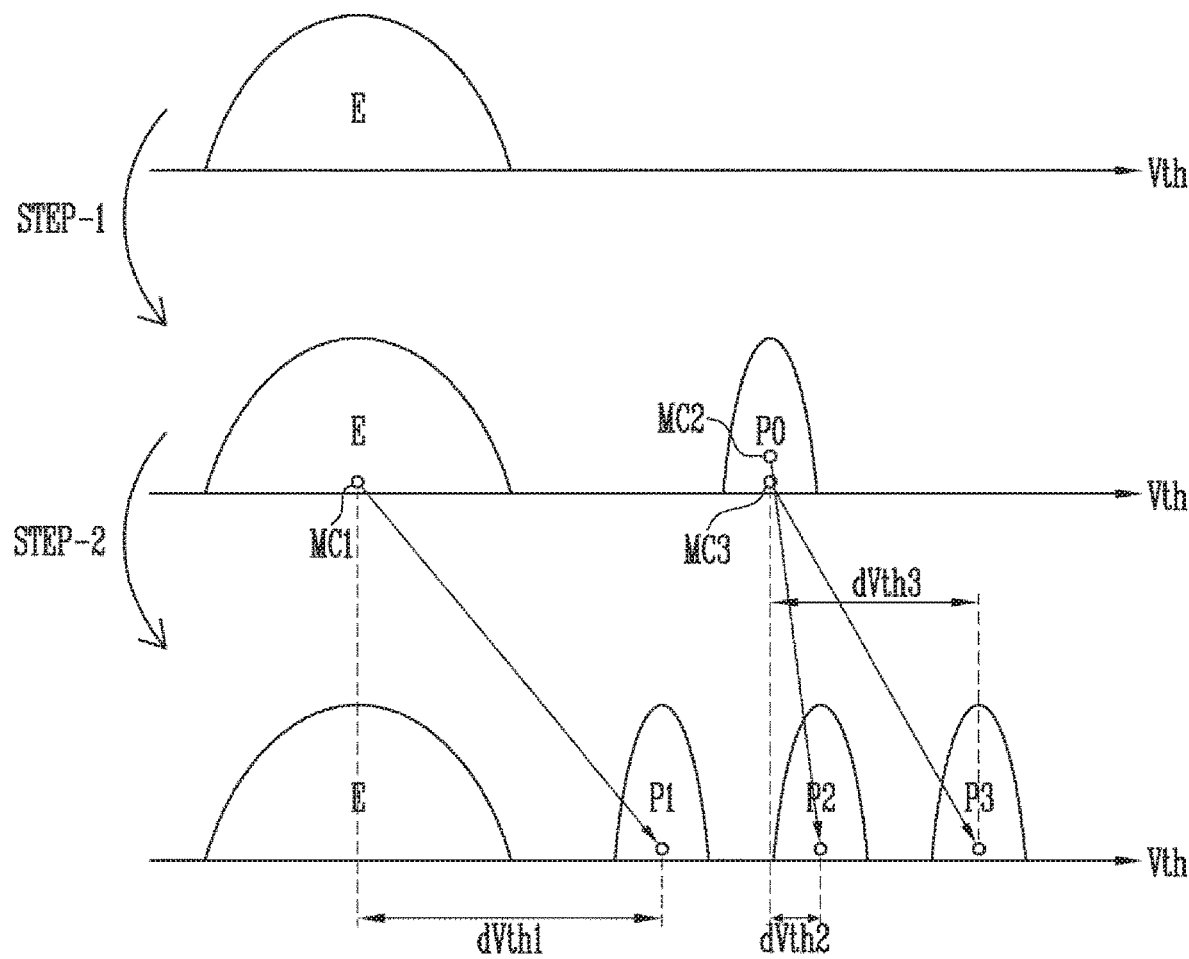
FIG. 8 is a diagram explaining changes in the threshold voltages of memory cells in a program operation.

FIG. 8 is a diagram explaining changes in the threshold voltages of memory cells in a program operation. In detail, FIG. 8 illustrates threshold voltage distributions of memory cells coupled to a single word line, i.e., memory cells included in one physical page PPG in a program operation.

Referring to FIG. 8, a memory cell MC may store two bits of data. When a memory block 110 is erased, the threshold voltages of memory cells included in one physical page PPG nr ay form an erase threshold voltage distribution E. When a program operation is initiated, least significant bit (LSB) page data may be programmed first to the physical page PPG at step-1. When the programming of the LSB page data is completed, the threshold voltages of memory cells included in one physical page PPG may form an erase threshold voltage distribution E and a lower program threshold voltage distribution P0. In an example, the threshold voltages of memory cells having LSB page data of '1' may be included in the erase threshold voltage distribution E, and the threshold voltages of memory cells having LSB page data of '0' may be included in the lower program threshold voltage distribution P0.

After the programming of the LSB page data to the physical page PPG has been completed, the programming of most significant bit (MSB) page data may be performed at step-2. When the programming of the MSB page data has been completed, the threshold voltages of memory cells included in one physical page PPG may form an erase threshold voltage distribution E, a first program threshold voltage distribution P1, a second program threshold voltage distribution P2, and a third program threshold voltage distribution P3. In an example, the threshold voltages of memory cells having LSB page data of '1' and MSB page data of '1' may be included in the erase threshold voltage distribution E, and the threshold voltages of memory cells having LSB page data of '1' and MSB page data of '0' may be included in the first program threshold voltage distribution P1. Further, the threshold voltages of memory cells having LSB page data of '0' and MSB page data of '0' may be included in the second program threshold voltage distribution P2, and the threshold voltages of memory cells having LSB page data of '0' and MSB page data of '1' may be included in the third program threshold voltage distribution P3.

In the above-described example, when programming of MSB page data is performed after programming of LSB page data to the physical page PPG has been completed, the threshold voltages of memory cells having LSB page data of '1' and MSB page data of '1' may not change. The reason for this is that the threshold voltages of memory cells having LSB page data of '1' and MSB page data of '1' may remain in the erase threshold voltage distribution E without change.

Here, the threshold voltages of memory cells having LSB page data of '1' and MSB page data of '0' (e.g., first memory cell MC1) may be shifted from the erase threshold voltage distribution E to the first program threshold voltage distribution P1. In this case, the threshold voltages of the memory cells having LSB page data of '1' and MSB page data of '0' may change by, for example, a first threshold voltage dVth1.

Furthermore, the threshold voltages of memory cells having LSB page data of '0' and MSB page data of '0' (e.g., second memory cell MC2) may be shifted from the lower program threshold voltage distribution P0 to the second program threshold voltage distribution P2. In this case, the threshold voltages of the memory cells having LSB page data of '0' and MSB page data of '0' may change by, for example, a second threshold voltage dVth2. Finally, the threshold voltages of memory cells having LSB page data of '0' and MSB page data of '1' (e.g., third memory cell MC3) may be shifted from the lower program threshold voltage distribution P0 to the third program threshold voltage distribution P3. In this case, the threshold voltages of the memory cells having LSB page data of '0' and MSB page data of '1' may change by, for example, a third threshold voltage dVth3.

In the above-described example, a relationship of the first threshold voltage dVth1>second threshold voltage dVth2 or third threshold voltage dVth3 may be established. In other words, while the MSB page data is programmed, the threshold voltage of a memory cell which has been shifted to the first program threshold voltage distribution P1 may change more than the threshold voltage of a memory cell which has been shifted to the second program threshold voltage distribution P2 or the third program threshold voltage distribution P3. Further, while the MSB page data is programmed, the threshold voltage of a memory cell which has been shifted to the third program threshold voltage distribution P3 may change more than the threshold voltage of a memory cell which has been shifted to the second program threshold voltage distribution P2.

Figure 9:
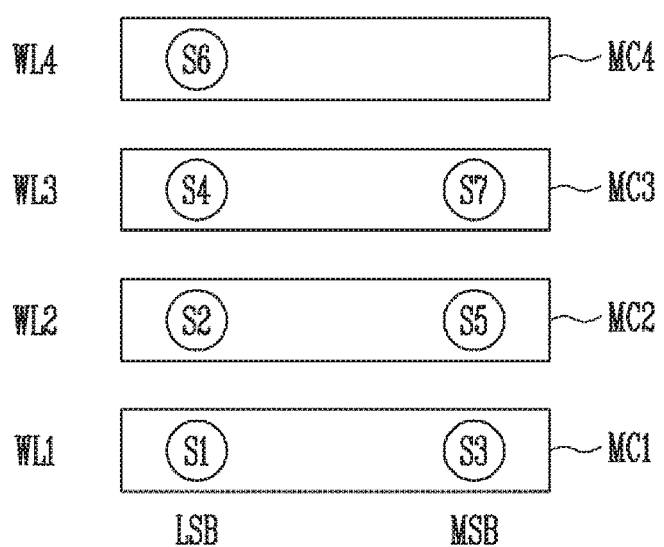
FIG. 9 is a diagram explaining a program sequence of memory cells.

FIG. 9 is a diagram for explaining a program sequence of memory cells.

Referring to FIG. 9, each memory cell MC may store two bits of data. Here, after an LSB has been programmed, an MSB may be programmed.

First, an LSB may be programmed to a first memory cell MC1 coupled to a first word line WL1 at step S1. Then, before an MSB is programmed to the first memory cell MC1, an LSB may be programmed to a second memory cell MC2 coupled to a second word line WL2 at step S2. Then, after the LSB has been programmed to the second memory cell MC2 coupled to the second word line WL2, the MSB may be programmed to the first memory cell MC1 at step S3. Next, after the MSB has been programmed to the first memory cell MC1, an LSB may be programmed to a third memory cell MC3 coupled to a third word line WL3 at step S4.

After the LSB has been programmed to the third memory cell MC3, an MSB may be programmed to the second memory cell MC2 at step S5. Next, an LSB has been programmed to a fourth memory cell MC4 coupled to a fourth word line WL4 at step S6, and then an MSB may be programmed to the third memory cell MC3 at step S7.

In the above-described example, the first memory cell MC1 may be arranged closest to a source select transistor SST, and second through n-th memory cells may be respectively arranged farther away from the SST.

A method of programming multi-bit data to memory cells in the foregoing sequence may be referred to as a "shadow program algorithm."

Figure 10:
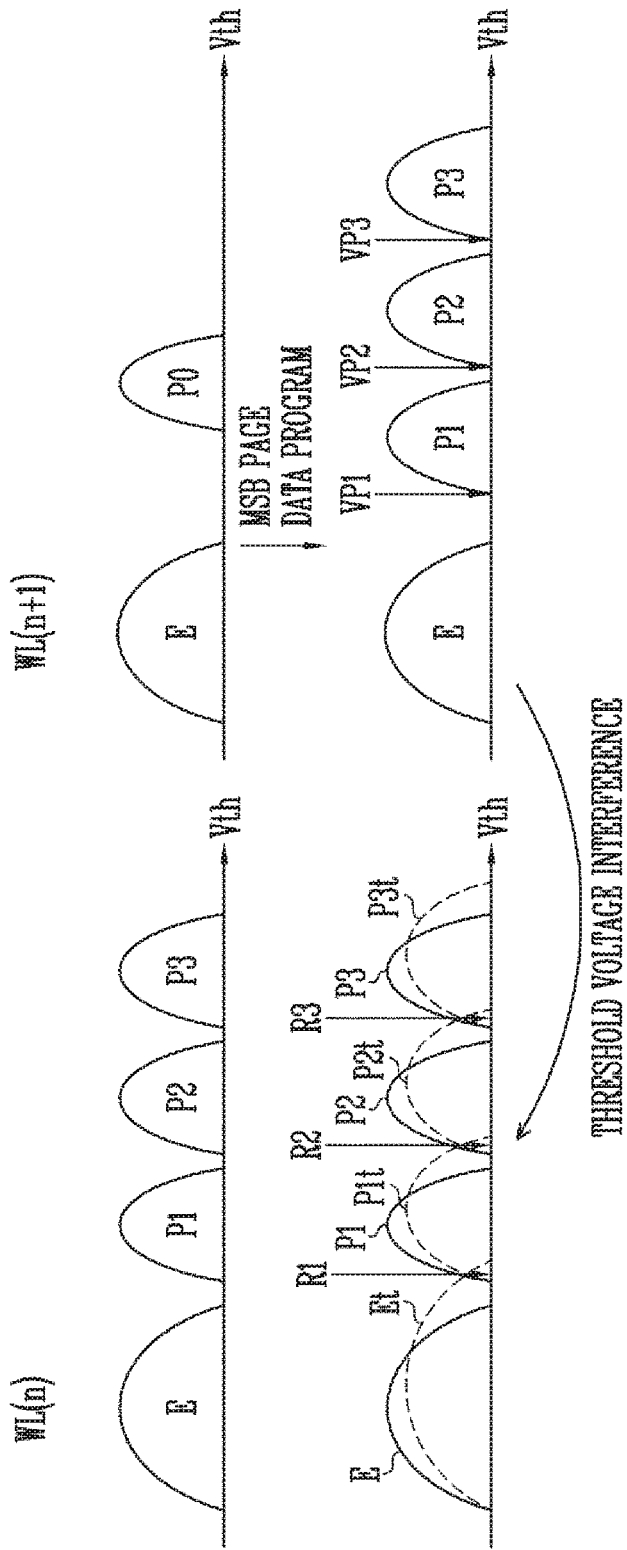
FIG. 10 is a diagram explaining a threshold voltage interference phenomenon occurring during a program operation.

FIG. 10 is a diagram explaining a threshold voltage interference phenomenon occurring during a program operation.

Referring to FIG. 10, programming of LSB page data and MSB page data to memory cells coupled to an n-th word line WL(n) of a memory block 110 may be completed, and programming of LSB page data to memory cells coupled to an (n+1)-th word line WL(n+1) may be completed. Here, the threshold voltages of the memory cells coupled to WL(n) may form an erase threshold voltage distribution E, a first program threshold voltage distribution P1, a second program threshold voltage distribution P2, and a third program threshold voltage distribution P3. Further, the threshold voltages of the memory cells coupled to WL(n+1) may form an erase threshold voltage distribution E and a lower program threshold voltage distribution P0.

Thereafter, in the program sequence described above with reference to FIG. 9, programming of MSB page data to the memory cells coupled to WL(n+1) may be performed, as described with reference to the step S5. As a result, the threshold voltages of the memory cells coupled to WL(n+1) may form an erase threshold voltage distribution E, a first program threshold voltage distribution P1, a second program threshold voltage distribution P2, and a third program threshold voltage distribution P3. Here, P1, P2, and P3 may be formed based on a first program verify voltage VP1, a second program verify voltage VP2, and a third program verify voltage VP3, respectively.

Due to the changes in the threshold voltages of memory cells coupled to WL(n+1), the threshold voltages of the memory cells coupled to WL(n) may change. This may result from the above-described threshold voltage interference between adjacent memory cells, that is, floating gate coupling. As a result, the widths of the threshold voltage distributions of the memory cells coupled to WL(n), that is, the threshold voltage distributions E, P1, P2, and P3 may be increased to an interference erase threshold voltage distribution Et, a first interference program threshold voltage distribution P1t, a second interference program threshold voltage distribution P2t, and a third interference program threshold voltage distribution P3t, respectively.

Data stored in the memory cells coupled to WL(n) may be read based on a first read voltage R1, a second read voltage R2, and a third read voltage R3. Here, the first read voltage R1, the second read voltage R2, and the third read voltage R3 may be set optimally for the interference erase threshold voltage distribution Et, the first interference program threshold voltage distribution P1t, the second interference program threshold voltage distribution P2t, and the third interference program threshold voltage distribution P3t.

Here, an error may occur in a read operation due to an overlap between threshold voltage distributions of the interference erase threshold voltage distribution Et, the first interference program threshold voltage distribution P1t, the second interference program threshold voltage distribution P2t, and the third interference program threshold voltage distribution P3t. In an example, when the overlap between the threshold voltage distributions of Et, P1t, P2t, and P3t is large, the level of the error occurring in the read operation may increase, so that error correction by the error checking and correction unit 730 may fail, with the result that the read operation may fail.

Figure 11:
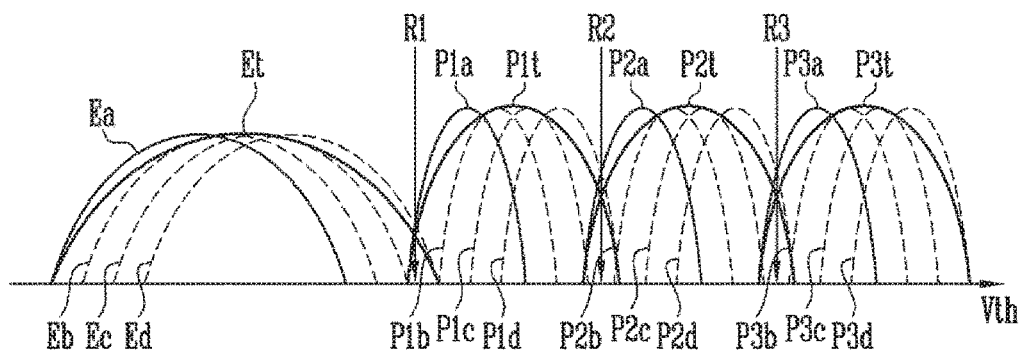
FIG. 11 is a diagram illustrating in detail threshold voltage distributions of memory cells.

FIG. 11 is a diagram illustrating in detail threshold voltage distributions of memory cells.

Referring to FIG. 11, when MSB page data is programmed to memory cells coupled to WL(n+1), the widths of the threshold voltage distributions of memory cells coupled to WL(n), that is, an erase threshold voltage distribution E, a first program threshold voltage distribution P1, a second program threshold voltage distribution P2, and a third program threshold voltage distribution P3, may be increased to an interference erase threshold voltage distribution Et, a first interference program threshold voltage distribution P1t, a second interference program threshold voltage distribution P2t, and a third interference program threshold voltage distribution P3t, respectively.

The interference erase threshold voltage distribution Et may be divided into an a-th interference erase threshold voltage distribution Ea, a b-th interference erase threshold voltage distribution Eb, a c-th interference erase threshold voltage distribution Ec, and a d-th interference erase threshold voltage distribution Ed. Further, the first interference program threshold voltage distribution P1t may be divided into a 1a-th interference program threshold voltage distribution P1a, a 1b-th interference program threshold voltage distribution P1b, a 1c-th interference program threshold voltage distribution P1c, and a 1d-th interference program threshold voltage distribution P1d. The second interference program threshold voltage distribution P2t may be divided into a 2a-th interference program threshold voltage distribution P2a, a 2b-th interference program threshold voltage distribution P2b, a 2c-th interference program threshold voltage distribution P2c, and a 2d-th interference program threshold voltage distribution P2d. Finally, the third interference program threshold voltage distribution P3t may be divided into a 3a-th interference program threshold voltage distribution P3a, a 3b-th interference program threshold voltage distribution P3b, a 3c-th interference program threshold voltage distribution P3c, and a 3d-th interference program threshold voltage distribution P3d.

Here, the threshold voltages of memory cells among memory cells coupled to WL(n), which are adjacent to memory cells coupled to WL(n−1) forming the a-th interference erase threshold voltage distribution Ea, the 1a-th interference program threshold voltage distribution P1a, the 2a-th interference program threshold voltage distribution P2a, or the 3a-th interference program threshold voltage distribution P3a may be included in the erase threshold voltage distribution E.

In other words, during the programming of MSB page data, the shift of threshold voltages of memory cells in the erase threshold voltage distribution E, among the memory cells coupled to WL(n+1), may be smallest or may not occur. As a result, the threshold voltages of the memory cells coupled to WL(n) adjacent to the memory cells coupled to WL(n+1) and having the erase threshold voltage distribution E may form the a-th interference erase threshold voltage distribution Ea, the 1a-th interference program threshold voltage distribution P1a, the 2a-th interference program threshold voltage distribution P2a, or the 3a-th interference program threshold voltage distribution P3a, which have also the most smallest change amounts respectively among the group of interference erase threshold voltage distributions Ea to Ed, the group of interference first program threshold voltage distributions P1a to P1d, the group of interference second program threshold voltage distributions P2a to P2d and the group of interference third program threshold voltage distributions P3a to P3d.

Further, the threshold voltages of memory cells, which are coupled to WL(n+1) and adjacent to memory cells forming the b-th interference erase threshold voltage distribution Eb, the 1b-th interference program threshold voltage distribution P1b, the 2b-th interference program threshold voltage distribution P2b, or the 3b-th interference program threshold voltage distribution P3b among the memory cells coupled to the n-th word line WL(n), may be included in the second program threshold voltage distribution P2.

In other words, during the programming of MSB page data, the shift of threshold voltages of memory cells in the second program threshold voltage distribution P2, among the memory cells coupled to WL(n+1), may be greater than that of the memory cells included in the erase threshold voltage distribution E. As a result, the threshold voltages of the memory cells coupled to WL(n) adjacent to the memory cells coupled to WL(n+1) and having the second program threshold voltage distribution P2 may form the b-th interference erase threshold voltage distribution Eb, the 1b-th interference program threshold voltage distribution P1b, the 2b-th interference program threshold voltage distribution P2b, or the 3b-th interference program threshold voltage distribution P3b, which have the second smallest change amounts respectively among the group of interference erase threshold voltage distributions Ea to Ed, the group of interference first program threshold voltage distributions P1a to P1d, the group of interference second program threshold voltage distributions P2a to P2d and the group of interference third program threshold voltage distributions P1a to P3d.

Further, the threshold voltages of memory cells, which are coupled to WL(n+1) and adjacent to memory cells forming the c-th interference erase threshold voltage distribution Ec, the 1c-th interference program threshold voltage distribution P1c, the 2c-th interference program threshold voltage distribution P2c, or the 3c-th interference program threshold voltage distribution P3c, among the memory cells coupled to WL(n), may be included in the third program threshold voltage distribution P3.

In other words, during the programming of MSB page data, the shift of the threshold voltages of memory cells included in the third program threshold voltage distribution P3, among the memory cells coupled to WL(n+1), may be greater than that of the memory cells included in the second program threshold voltage distribution P2. As a result, the threshold voltages of the memory cells coupled to WL(n) adjacent to the memory cells coupled to WL(n+1) and having the third program threshold voltage distribution P3 may form the c-th interference erase threshold voltage distribution Ec, the 1c-th interference program threshold voltage distribution P1c, the 2c-th interference program threshold voltage distribution P2c, or the 3c-th interference program threshold voltage distribution P3c, which have the second greatest change amounts respectively among the group of interference erase threshold voltage distributions Ea to Ed, the group of interference first program threshold voltage distributions P1a to P1d, the group of interference second program threshold voltage distributions P2a to P2d and the group of interference third program threshold voltage distributions P1a to P3d.

Finally, the threshold voltages of memory cells, which are coupled to word line WL(n+1) and adjacent to memory cells forming the d-th interference erase threshold voltage distribution Ed, the 1d-th interference program threshold voltage distribution P1d, the 2d-th interference program threshold voltage distribution P2d, or the 3d-th interference program threshold voltage distribution P3d, among the memory cells coupled to WL(n), may be included in the first program threshold voltage distribution P1.

In other words, during the programming of MSB page data, the shift of the threshold voltages of memory cells included in the first program threshold voltage distribution P1, among the memory cells coupled to WL(n+1), may be greater than that of the memory cells included in the third program threshold voltage distribution P3. As a result, the threshold voltages of the memory cells coupled to WL(n) adjacent to the memory cells coupled to WL(n+1) and having the first program threshold voltage distribution P1 may form the d-th interference erase threshold voltage distribution Ed, the 1d-th interference program threshold voltage distribution P1d, the 2d-th interference program threshold voltage distribution P2d, or the 3d-th interference program threshold voltage distribution P3d, which have the greatest change amounts respectively among the group of interference erase threshold voltage distributions Ea to Ed, the group of interference first program threshold voltage distributions P1a to P1d, the group of interference second program threshold voltage distributions P2a to P2d and the group of interference third program threshold voltage distributions P3a to P3d.

Data stored in the memory cells coupled to the n-th word line WL(n) may be read based on a first read voltage R1, a second read voltage R2, and a third read voltage R3. Here, the first read voltage R1, the second read voltage R2, and the third read voltage R3 may be read voltages which are set optimally for the interference erase threshold voltage distribution Et, the first interference program threshold voltage distribution P1t, the second interference program threshold voltage distribution P2t, and the third interference program threshold voltage distribution P3t.

Here, an error may occur in a read operation due to an overlap between threshold voltage distributions of the interference erase threshold voltage distribution Et, the first interference program threshold voltage distribution P1t, the second interference program threshold voltage distribution P2t, and the third interference program threshold voltage distribution P3t. In an example, when the overlap between the threshold voltage distributions of Et, P1t, P2t, and P3t is large, the level of the error occurring in the read operation may increase, so that error correction by the error checking and correction unit 730 may fail, with the result that the read operation may fail.

When the a-th interference erase threshold voltage distribution Ea, the b-th interference erase threshold voltage distribution Eb, and the c-th interference erase threshold voltage distribution Ec are individually shifted to overlap the d-th interference erase threshold voltage distribution Ed, an overall erase threshold voltage distribution may be formed similar to Ed.

Further, when the 1a-th interference program threshold voltage distribution P1a, the 1b-th interference program threshold voltage distribution P1b, and the 1c-th interference program threshold voltage distribution P1c are individually shifted to overlap the 1d-th interference program threshold voltage distribution P1d, an overall first program threshold voltage distribution may be formed similar to P1d.

In the same manner, when the 2a-th interference program threshold voltage distribution P2a, the 2b-th interference program threshold voltage distribution P2b, and the 2c-th interference program threshold voltage distribution P2c are individually shifted to overlap the 2d-th interference program threshold voltage distribution P2d, the overall second program threshold voltage distribution may be formed similar to P2d.

Furthermore, when the 3a-th interference program threshold voltage distribution P3a, the 3b-th interference program threshold voltage distribution P3b, and the 3c-th interference program threshold voltage distribution P3c are individually shifted to overlap the 3d-th interference program threshold voltage distribution P3d, an overall third program threshold voltage distribution may be formed similar to P3d.

As described above, when the overall erase threshold voltage distribution is formed similar to the d-th interference erase threshold voltage distribution Ed, the overall first program threshold voltage distribution is formed similar to the 1d-th interference program threshold voltage distribution P1d, the overall second program threshold voltage distribution is formed similar to the 2d-th interference program threshold voltage distribution P2d, and the overall third program threshold voltage distribution is formed similar to the 3d-th interference program threshold voltage distribution P3d, the overlap between adjacent threshold voltage distributions may be reduced or removed, and thus a read operation may succeed when the read operation is performed.

A method of forming the overall erase threshold voltage distribution similar to the d-th interference erase threshold voltage distribution Ed, forming the overall first program threshold voltage distribution similar to the 1d-th interference program threshold voltage distribution P1d, forming the overall second program threshold voltage distribution similar to the 2d-th interference program threshold voltage distribution P2d, and forming the overall third program threshold voltage distribution similar to the 3d-th interference program threshold voltage distribution P3d will be described in detail below.

Figure 12:
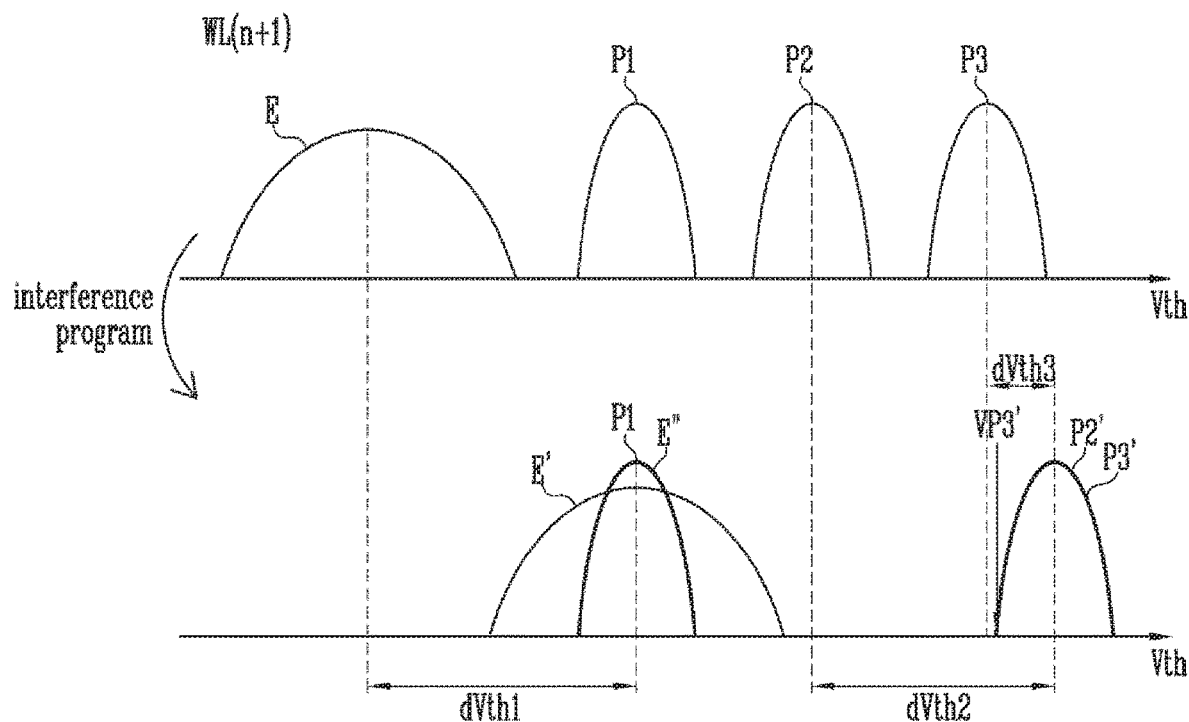
FIG. 12 is a diagram illustrating an interference program operation according to an embodiment of the present disclosure.
Figure 13:
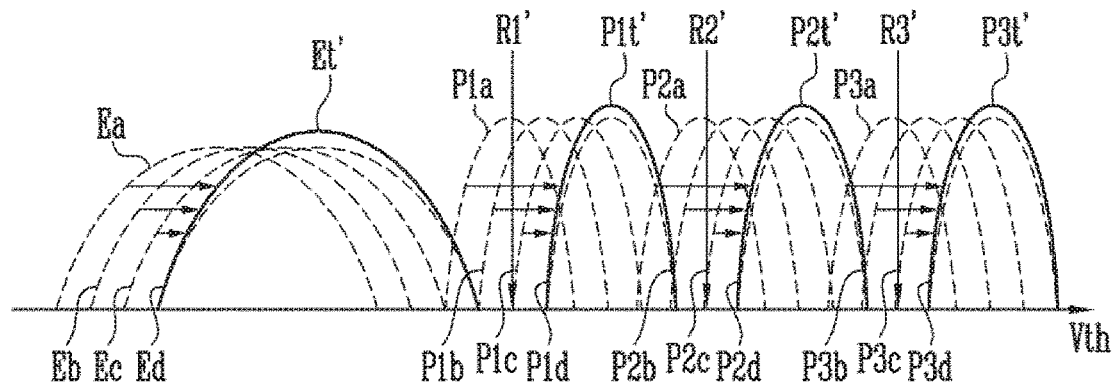
FIG. 13 is a diagram illustrating an operation of recovering a failure in a read operation depending on an interference program operation according to an embodiment of the present disclosure.

FIG. 12 is a diagram illustrating an interference program operation according to an embodiment of the present disclosure. FIG. 13 is a diagram explaining the operation of recovering a failure in a read operation due to an interference program operation according to an embodiment of the present disclosure.

Referring to FIG. 12, when a read operation on memory cells coupled to an n-th word line WL(n) fails, that is, when an error correction operation on data read from the memory cells coupled to WL(n) fails, an interference program operation may be performed on memory cells coupled to an (n+1)-th word line WL(n+1).

The interference program operation may change the threshold voltages of memory cells in the erase threshold voltage distribution E and coupled to WL(n+1) by the largest threshold voltage (i.e., a first threshold voltage dVth1 shown in FIG. 12) to the first program threshold voltage distribution P1. The reason for this is that, during the programming of MSB page data, the shift of the threshold voltages of memory cells included in the erase threshold voltage distribution E is smallest or is not present, and thus the shift of the threshold voltages of adjacent memory cells attributable to floating gate coupling is smallest.

The threshold voltage distribution of memory cells coupled to WL(n) of FIG. 11, which are adjacent to the memory cells in the erase threshold voltage distribution E, among the memory cells coupled to WL(n+1), may be any one of an a-th interference erase threshold voltage distribution Ea, a 1a-th interference program threshold voltage distribution P1a, a 2a-th interference program threshold voltage distribution P2a, and a 3a-th interference program threshold voltage distribution P3a.

As shown in FIG. 12, the erase threshold voltage distribution E' or E" formed by the interference program operation to the memory cells coupled to WL(n+1) and included in the erase threshold voltage distribution E may be formed with a width greater than that of the first program threshold voltage distribution P1 (in case of E') or with a width identical to that of P1 (in case of E").

The shift of the erase threshold voltage distribution E of memory cells coupled to WL(n+1) to the new erase threshold voltage distribution E' or E" may shift the threshold voltages of the memory cells included in the a-th interference erase threshold voltage distribution Ea, the 1a-th interference program threshold voltage distribution P1a, the 2a-th interference program threshold voltage distribution P2a or the 3a-th interference program threshold voltage distribution P3a, among the memory cells coupled to WL(n) of FIG. 11, to a d-th interference erase threshold voltage distribution Ed, a 1d-th interference program threshold voltage distribution P1d, a 2d-th interference program threshold voltage distribution P2d or a 3d-th interference program threshold voltage distribution P3d, respectively.

Further, the interference program operation may change the threshold voltages of memory cells in the second program threshold voltage distribution P2 and coupled to WL(n+1) by the second largest threshold voltage (i.e., a second threshold voltage dVth2 shown in FIG. 12) to a second program threshold voltage distribution P2'. Referring to FIG. 12, the first threshold voltage dVth1 may be greater than the second threshold voltage dVth2. The reason for this is that, during the programming of MSB page data, the shift of the threshold voltages of memory cells which are adjacent to the memory cells included in the second program threshold voltage distribution P2 due to floating gate coupling is greater than the shift of the threshold voltages of memory cells which are adjacent to the memory cells included in the erase threshold voltage distribution E due to floating gate coupling.

The threshold voltage distribution of the memory cells coupled to WL(n) of FIG. 11, which are adjacent to the memory cells in the second program threshold voltage distribution P2 among the memory cells coupled to WL(n+1), may be any one of a b-th interference erase threshold voltage distribution Eb, a 1b-th interference program threshold voltage distribution P1b, a 2b-th interference program threshold voltage distribution P2b, and a 3b-th interference program threshold voltage distribution P3b.

As shown in FIG. 12, the second program threshold voltage distribution P2' formed by the interference program operation to the memory cells coupled to WL(n+1) and the second program threshold voltage distribution P2 may be slightly higher than the third program threshold voltage distribution P3.

The shift of the second program threshold voltage distribution P2 of the memory cells coupled to WL(n+1) to the new second program threshold voltage distribution P2' may shift the threshold voltages of the memory cells in the b-th interference erase threshold voltage distribution Eb, the 1b-th interference program threshold voltage distribution P1b, the 2b-th interference program threshold voltage distribution P2b, and the 3b-th interference program threshold voltage distribution P3b, of the memory cells coupled to WL(n) of FIG. 11, to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

Furthermore, the interference program operation may change the threshold voltages of memory cells in the third program threshold voltage distribution P3 and coupled to WL(n+1) by the thirdly largest threshold voltage (i.e., a third threshold voltage dVth3 shown in FIG. 12) to a third program threshold voltage distribution P3. Referring to FIG. 12, the second threshold voltage dVth2 may be greater than that of the third threshold voltage dVth3. The reason for this is that, during the programming of MSB page data, the shift of the threshold voltages of memory cells which are adjacent to the memory cells included in the third program threshold voltage distribution P3 due to floating gate coupling is greater than the shift of the threshold voltages of memory cells which are adjacent to the memory cells included in the second program threshold voltage distribution P2 due to floating gate coupling.

The threshold voltage distribution of memory cells coupled to the n-th word line WL(n) of FIG. 11, which are adjacent to the memory cells in the third program threshold voltage distribution P3 among the memory cells coupled to WL(n+1), may be any one of the c-th interference erase threshold voltage distribution Ec, the 1c-th interference program threshold voltage distribution P1c, the 2c-th interference program threshold voltage distribution P2c, and the 3c-th interference program threshold voltage distribution P3c.

As shown in FIG. 12, the third program threshold voltage distribution P3' formed by the interference program operation to the memory cells coupled to WL(n+1) and in the third program threshold voltage distribution P3 may be slightly higher than the third program threshold voltage distribution P3.

The shift of the third program threshold voltage distribution P3 of the memory cells coupled to WL(n+1) to a new third program threshold voltage distribution P3' may shift the threshold voltages of the memory cells in the c-th interference erase threshold voltage distribution Ec, the 1c-th interference program threshold voltage distribution P1c, the 2c-th interference program threshold voltage distribution P2c, and the 3c-th interference program threshold voltage distribution P3c, of the memory cells coupled to WL(n) of FIG. 11, to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

Formation of the above-described new second program threshold voltage distribution P2' and new third program threshold voltage distribution P3' may be performed based on a varied third program verify voltage VP3'. The varied third program verify voltage VP3' may be a voltage greater than the third program verify voltage VP3 of FIG. 10.

The interference program operation to the memory cells coupled to WL(n+1) may not shift the threshold voltages of memory cells in the first program threshold voltage distribution P1 and coupled to WL(n). The reason for this is that, during the programming of MSB page data, the shift of the threshold voltages of memory cells (i.e., the memory cells coupled to WL(n)) adjacent to the memory cells in the first program threshold voltage distribution P1 and coupled to WL(n+1) due to floating gate coupling may be greater than the shift of the threshold voltages of memory cells in the erase threshold voltage distribution E, the second program threshold voltage distribution P2, and the third program threshold voltage distribution P3. The threshold voltage distribution of the memory cells coupled to WL(n) of FIG. 11, which are adjacent to the memory cells in the first program threshold voltage distribution P1 and coupled to WL(n+1), may be any one of the d-th interference erase threshold voltage distribution Ed, the 1d-th interference program threshold voltage distribution P1d, the 2d-th interference program threshold voltage distribution P2d, and the 3d-th interference program threshold voltage distribution P3d.

Referring to FIG. 13, by the above-described interference program operation, the threshold voltages of memory cells, which are in the a-th interference erase threshold voltage distribution Ea, the b-th interference erase threshold voltage distribution Eb, or the c-th interference erase threshold voltage distribution Ec, among the memory cells coupled to WL(n), may be individually shifted to overlap the d-th interference erase threshold voltage distribution Ed. Also, the overall erase threshold voltage distribution may be the new erase threshold voltage distribution Et', which is similar to Ed.

Further, by the interference program operation, the threshold voltages of memory cells, which are in the 1a-th interference program threshold voltage distribution P1a, the 1b-th interference program threshold voltage distribution P1b, or the 1c-th interference program threshold voltage distribution P1c, among the memory cells coupled to WL(n), may be individually shifted to overlap the 1d-th interference program threshold voltage distribution P1d. Also, the overall first program threshold voltage distribution may be the new first program threshold voltage distribution P1t', which is similar to P1d.

Further, by the interference program operation, the threshold voltages of memory cells, which are in the 2a-th interference program threshold voltage distribution P2a, the 2b-th interference program threshold voltage distribution P2b, or the 2c-th interference program threshold voltage distribution P2c, among the memory cells coupled to WL(n), may be individually shifted to overlap the 2d-th interference program threshold voltage distribution P2d. Also, the overall second program threshold voltage distribution may be the new second program threshold voltage distribution P2t', which is similar to P2d.

Further, by the interference program operation, the threshold voltages of memory cells, which are in the 3a-th interference program threshold voltage distribution P3a, the 3b-th interference program threshold voltage distribution P3b, or the 3c-th interference program threshold voltage distribution P3c, among the memory cells coupled to WL(n), may be individually shifted to overlap the 3d-th interference program threshold voltage distribution P3d. Also, the overall third program threshold voltage distribution may be the new third program threshold voltage distribution P3t', which is similar to P3d.

Here, when a read operation is performed on the memory cells coupled to WL(n) using a first changed read voltage R1', a second changed read voltage R2', and a third changed read voltage R3', the read operation may succeed. The first changed read voltage R1' may be greater than the first read voltage R1 of FIG. 11, and the second changed read voltage R2' may be greater than the second read voltage R2 of FIG. 11. Also, the third changed read voltage R3' may be greater than the third read voltage R3 of FIG. 11. Here, R1', R2', and R3' may be optimized for the new erase threshold voltage distribution Et', the new first program threshold voltage distribution P1t', the new second program threshold voltage distribution P2t', and the new third program threshold voltage distribution P3t'.

Figure 14:
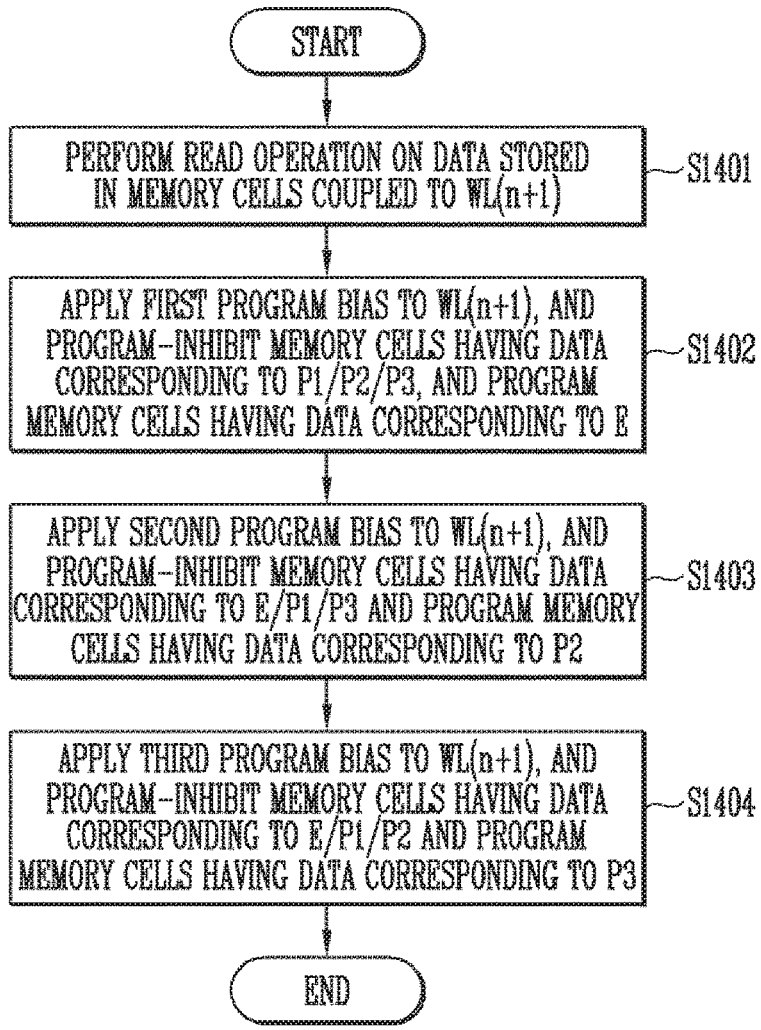
FIG. 14 is a flowchart describing an interference program operation according to an embodiment of the present disclosure.

FIG. 14 is a flowchart describing an interference program operation according to an embodiment of the present disclosure.

Referring to FIG. 14, when the interference program operation is initiated, a read operation may be performed on data stored in memory cells coupled to WL(n+1) at step S1401. Step S1401 may be controlled by a control logic 300, and may be performed using a read voltage generated by a voltage generation circuit 210. Further, the data read at step S1401 may be stored in a page buffer group 230.

Next, a first program bias may be applied to WL(n+1) and, at this time, memory cells, the threshold voltages of which correspond to any one of a first program threshold voltage distribution P1, a second program threshold voltage distribution P2, and a third program threshold voltage distribution P3, may be program-inhibited, and memory cells, the threshold voltages of which correspond to the erase threshold voltage distribution E, may be programmed at step S1402. Here, the memory cells corresponding to the erase threshold voltage distribution E may be identified based on data read by the read operation performed at step S1401. Step S1402 may be controlled by the control logic 300, and may be performed using the first program bias generated by the voltage generation circuit 210. Also, step S1402 may be performed based on the data stored in the page buffer group 230.

At step S1402, the erase threshold voltage distribution E of the memory cells coupled to WL(n+1) may be shifted to the new erase threshold voltage distribution E' or E" of FIG. 12. Further, at step S1402, the a-th interference erase threshold voltage distribution Ea, the 1a-th interference program threshold voltage distribution P1a, the 2a-th interference program threshold voltage distribution P2a, and the 3a-th interference program threshold voltage distribution P3a, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

In an embodiment, at step S1402, memory cells, the threshold voltages of which correspond to any one of the first program threshold voltage distribution P1, the second program threshold voltage distribution P2, and the third program threshold voltage distribution P3, may not be program-inhibited. In an embodiment, at step S1402, memory cells, the threshold voltages of which correspond to the first program threshold voltage distribution P1, may be program-inhibited, and memory cells, the threshold voltages of which correspond to any one of the second program threshold voltage distribution P2 and the third program threshold voltage distribution P3, may not be program-inhibited. The memory cells corresponding to any one of the first to third program threshold voltage distributions may be identified based on the data stored in the page buffer group 230.

A second program bias may be applied to WL(n+1) and, at this time, memory cells, the threshold voltages of which correspond to any one of the erase threshold voltage distribution E, the first program threshold voltage distribution P1, and the third program threshold voltage distribution P3 may be program-inhibited, and memory cells, the threshold voltages of which correspond to the second program threshold voltage distribution P2, may be programmed at step S1403. Here, the second program bias may have a voltage greater than that of the first program bias. Here, the memory cells corresponding to the second program threshold voltage distribution P2 may be identified based on the data read by the read operation performed at step S1401. Step S1403 may be controlled by the control logic 300, and may be performed using the second program bias generated by the voltage generation circuit 210. Also, step S1403 may be performed based on the data stored in the page buffer group 230.

At step S1403, the second program threshold voltage distribution P2 of the memory cells coupled to WL(n+1) may be shifted to the new second program threshold voltage distribution P2' of FIG. 12. Also, at step S1403, the b-th interference erase threshold voltage distribution Eb, the 1b-th interference program threshold voltage distribution P1b, the 2b-th interference program threshold voltage distribution P2b, and the 3b-th interference program threshold voltage distribution P3b, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

In an embodiment, at step S1403, memory cells, the threshold voltages of which correspond to any one of the erase threshold voltage distribution E and the first program threshold voltage distribution P1, may be program-inhibited, and memory cells, the threshold voltages of which correspond to the third program threshold voltage distribution P3, may not be program-inhibited.

A third program bias may be applied to WL(n+1) and, at this time, memory cells, the threshold voltages of which correspond to any one of the erase threshold voltage distribution E, the first program threshold voltage distribution P1, and the second program threshold voltage distribution P2, may be program-inhibited, and memory cells, the threshold voltages of which correspond to the third program threshold voltage distribution P3, may be programmed at step S1404. The memory cells corresponding to the third program threshold voltage distribution P3 may be identified based on the data read by the read operation performed at step S1401. Here, the third program bias may have a voltage equal to or greater than that of the second program bias. Step S1404 may be controlled by the control logic 300, and may be performed using the third program bias generated by the voltage generation circuit 210. Also, step S1403 may be performed based on the data stored in the page buffer group 230.

At step S1404, the third program threshold voltage distribution P3 of the memory cells coupled to WL(n+1) may be shifted to the new third program threshold voltage distribution P3' of FIG. 12. Also, at step S1404, the c-th interference erase threshold voltage distribution Ec, the 1c-th interference program threshold voltage distribution P1c, the 2c-th interference program threshold voltage distribution P2c, and the 3c-th interference program threshold voltage distribution P3c, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

The sequence in which steps S1402 to S1404 are performed may change. Steps S1402 to S1404 may be performed either sequentially or in reverse order. That is, the sequence in which steps S1402 to S1404 are performed may be selectively set.

Through the above-described operations, the widths of respective threshold voltage distributions of memory cells coupled to WL(n) may be decreased, and the reliability of a read operation on the memory cells coupled to WL(n) may be further improved. Consequently, the reliability of a memory system 1000 may be improved.

Figure 15:
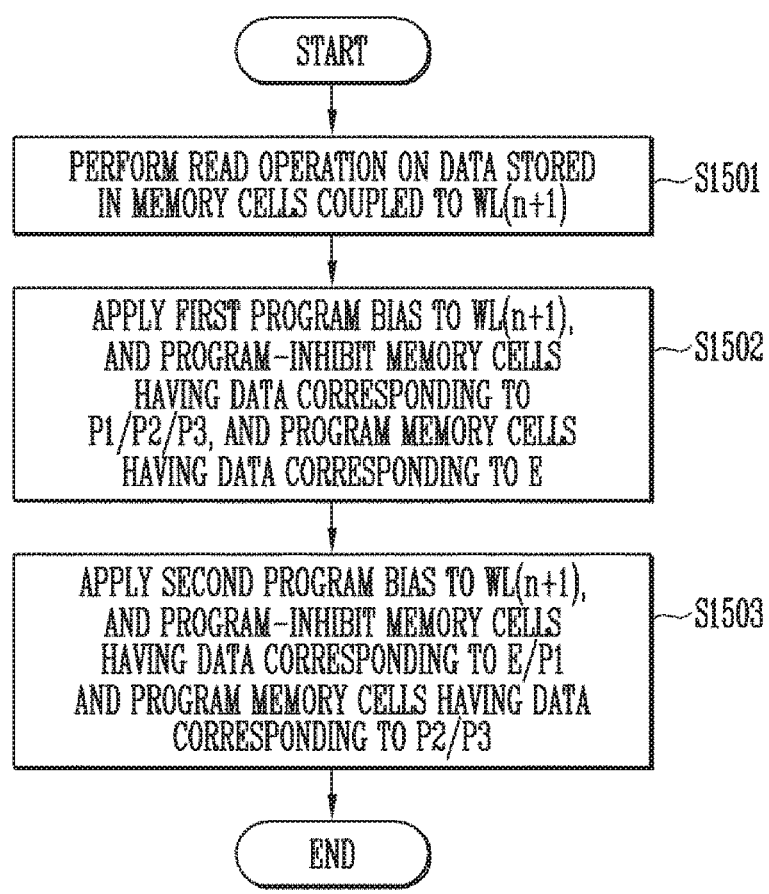
FIG. 15 is a flowchart describing an interference program operation according to an embodiment of the present disclosure.

FIG. 15 is a flowchart describing an interference program operation according to an embodiment of the present disclosure.

Referring to FIG. 15, when the interference program operation is initiated, a read operation may be performed on data stored in memory cells coupled to WL(n+1) at step S1501. Step S1501 may be controlled by a control logic 300, and may be performed using a read voltage generated by a voltage generation circuit 210. Further, the data read at step S1501 may be stored in a page buffer group 230.

Thereafter, a first program bias may be applied to WL(n+1) and, at this time, memory cells, the threshold voltages of which correspond to any one of a first program threshold voltage distribution P1, a second program threshold voltage distribution P2, and a third program threshold voltage distribution P3, may be program-inhibited, and memory cells, the threshold voltages of which correspond to an erase threshold voltage distribution E, may be programmed at step S1502. The memory cells corresponding to the erase threshold voltage distribution E may be identified based on the data read by the read operation performed at step S1501. Step S1502 may be controlled by the control logic 300, and may be performed using the first program bias generated by the voltage generation circuit 210. Also, step S1502 may be performed based on the data stored in the page buffer group 230.

At step S1502, the erase threshold voltage distribution E of the memory cells coupled to WL(n+1) may be shifted to the new erase threshold voltage distribution E' or E" of FIG. 12. Further, at step S1502, the a-th interference erase threshold voltage distribution Ea, the 1a-th interference program threshold voltage distribution P1a, the 2a-th interference program threshold voltage distribution P2a, and the 3a-th interference program threshold voltage distribution P3a, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

In an embodiment, at step S1502, memory cells, the threshold voltages of which correspond to any one of the first program threshold voltage distribution P1, the second program threshold voltage distribution P2, and the third program threshold voltage distribution P3, may not be program-inhibited. In an embodiment, at step S1502, memory cells, the threshold voltages of which correspond to the first program threshold voltage distribution P1, may be program-inhibited, and memory cells, the threshold voltages of which correspond to any one of the second program threshold voltage distribution P2 and the third program threshold voltage distribution P3, may not be program-inhibited. The memory cells corresponding to any one of the first to third program threshold voltage distributions may be identified based on the data stored in the page buffer group 230.

A second program bias may be applied to WL(n+1) and, at this time, memory cells, the threshold voltages of which correspond to the erase threshold voltage distribution E or the first program threshold voltage distribution P1, may be program-inhibited, and memory cells, the threshold voltages of which correspond to the second program threshold voltage distribution P2 or the third program threshold voltage distribution P3, may be programmed at step S1503. Here, the second program bias may have a voltage greater than that of the first program bias. Here, the memory cells corresponding to the second program threshold voltage distribution P2 or the third program threshold voltage distribution P3 may be identified based on the data read by the read operation performed at step S1501. Step S1503 may be controlled by the control logic 300, and may be performed using the second program bias generated by the voltage generation circuit 210. Also, step S1503 may be performed based on the data stored in the page buffer group 230.

At step S1503, the second program threshold voltage distribution P2 or the third program threshold voltage distribution P3 of the memory cells coupled to WL(n+1) may be shifted to the new second program threshold voltage distribution P2' or the new third program threshold voltage distribution P3' of FIG. 12. Since the new second program threshold voltage distribution P2' and the new third program threshold voltage distribution P3' of FIG. 12 have a similar threshold voltage magnitude, the operation of shifting the second program threshold voltage distribution P2 of the memory cells coupled to WL(n+1) to the new second program threshold voltage distribution P2' of FIG. 12 and the operation of shifting the third program threshold voltage distribution P3 to the new third program threshold voltage distribution P3' of FIG. 12 may be performed together using the same program bias.

Also, at step S1503, the b-th interference erase threshold voltage distribution Eb, the 1b-th interference program threshold voltage distribution P1b, the 2b-th interference program threshold voltage distribution P2b, and the 3b-th interference program threshold voltage distribution P3b, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

In addition, at step S1503, the third program threshold voltage distribution P3 of the memory cells coupled to WL(n+1) may be shifted to the new third program threshold voltage distribution P3' of FIG. 12. Also, at step S1503, the c-th interference erase threshold voltage distribution Ec, the 1c-th interference program threshold voltage distribution P1c, the 2c-th interference program threshold voltage distribution P2c, and the 3c-th interference program threshold voltage distribution P3c, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

Through the above-described operations, the widths of respective threshold voltage distributions of memory cells coupled to WL(n) may be decreased, and the reliability of a read operation on the memory cells coupled to WL(n) may be further improved. Consequently, the reliability of a memory system 1000 may be improved.

Figure 16:
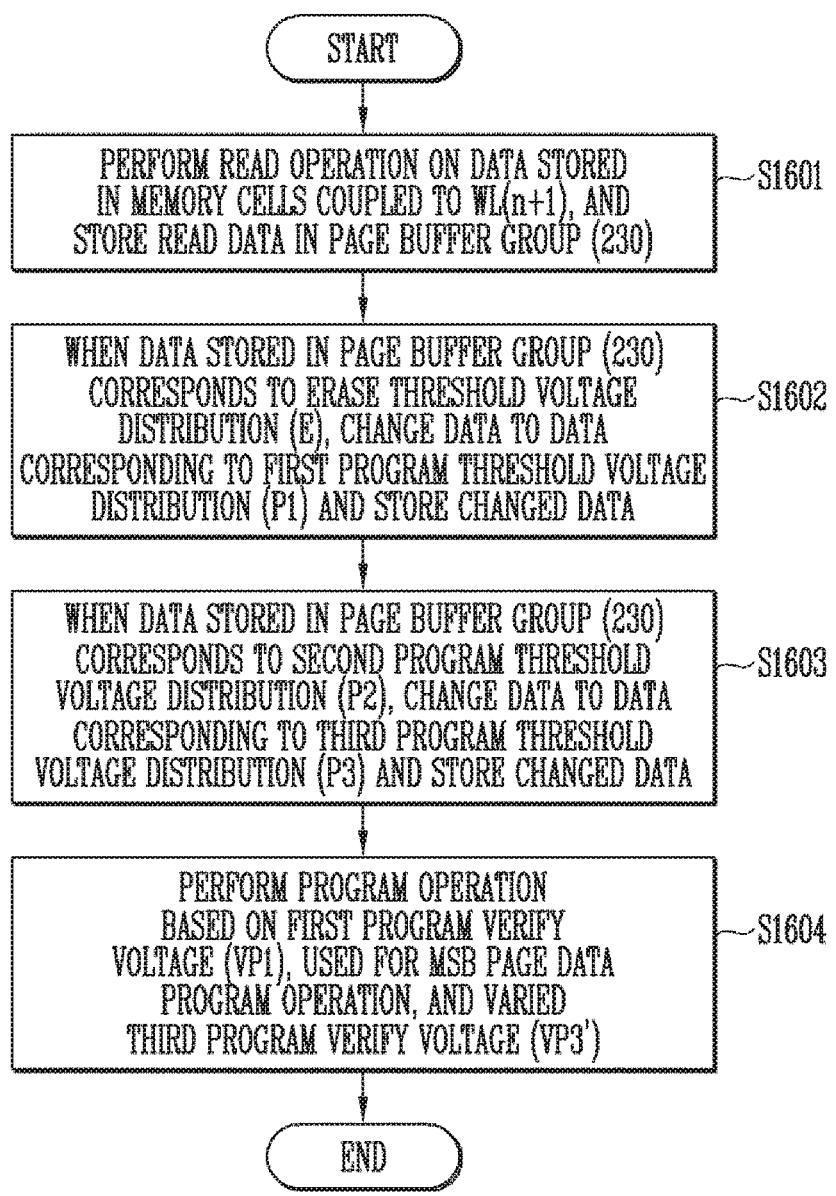
FIG. 16 is a flowchart describing an interference program operation according to an embodiment of the present disclosure.

FIG. 16 is a flowchart describing an interference program operation according to an embodiment of the present disclosure.

Referring to FIG. 16, when the interference program operation is initiated, a read operation may be performed on data stored in memory cells coupled to WL(n+1), and read data may be stored in a page buffer group 230 at step S1601. Step S1601 may be controlled by a control logic 300, and may be performed using a read voltage generated by a voltage generation circuit 210.

Thereafter, when the data stored in the page buffer group 230 corresponds to an erase threshold voltage distribution E, the data may change to data corresponding to a first program threshold voltage distribution P1 and then the changed data may be stored at step S1602.

Thereafter, when the data stored in the page buffer group 230 corresponds to a second program threshold voltage distribution P2, the data may change to data corresponding to a third program threshold voltage distribution P3 and then the changed data may be stored at step S1603.

Steps S1602 and S1603 may be performed by the page buffer group 230 under the control of the control logic 300.

After steps S1602 and S1603 have been performed, a program operation may be performed based on both a first program verify voltage VP1, which is used for an MSB page data program operation, and a varied third program verify voltage VP3' at step S1604. The varied third program verify voltage VP3' may be a voltage greater than a third program verify voltage VP3 used for the MSB page data program operation. The first program verify voltage VP1 and the varied third program verify voltage VP3' may be generated by the voltage generation circuit 210 under the control of the control logic 300.

When step S1604 is performed, the erase threshold voltage distribution E of the memory cells coupled to WL(n+1) may be shifted to the new erase threshold voltage distribution E' of FIG. 12. That is, the a-th interference erase threshold voltage distribution Ea, the 1a-th interference program threshold voltage distribution P1a, the 2a-th interference program threshold voltage distribution P2a, and the 3a-th interference program threshold voltage distribution P3a, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

When step S1604 is performed, the second program threshold voltage distribution P2 or the third program threshold voltage distribution P3 of the memory cells coupled to WL(n+1) may be shifted to the new second program threshold voltage distribution P2' or the new third program threshold voltage distribution P3' of FIG. 12. That is, the b-th interference erase threshold voltage distribution Eb, the 1b-th interference program threshold voltage distribution P1b, the 2b-th interference program threshold voltage distribution P2b, and the 3b-th interference program threshold voltage distribution P3b, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

In addition, at step S1604, the third program threshold voltage distribution P3 of the memory cells coupled to WL(n+1) may be shifted to the new third program threshold voltage distribution P3' of FIG. 12. Also, at step S1604, the c-th interference erase threshold voltage distribution Ec, the 1c-th interference program threshold voltage distribution P1c, the 2c-th interference program threshold voltage distribution P2c, and the 3c-th interference program threshold voltage distribution P3c, of the memory cells coupled to WL(n), of FIG. 13 may be shifted to the d-th interference erase threshold voltage distribution Ed, the 1d-th interference program threshold voltage distribution P1d, the 2d-th interference program threshold voltage distribution P2d, and the 3d-th interference program threshold voltage distribution P3d, respectively.

Through the above-described operations, the widths of respective threshold voltage distributions of memory cells coupled to WL(n) may be decreased, and the reliability of a read operation on the memory cells coupled to WL(n) may be further improved. Consequently, the reliability of a memory system 1000 may be improved.

Figure 17:
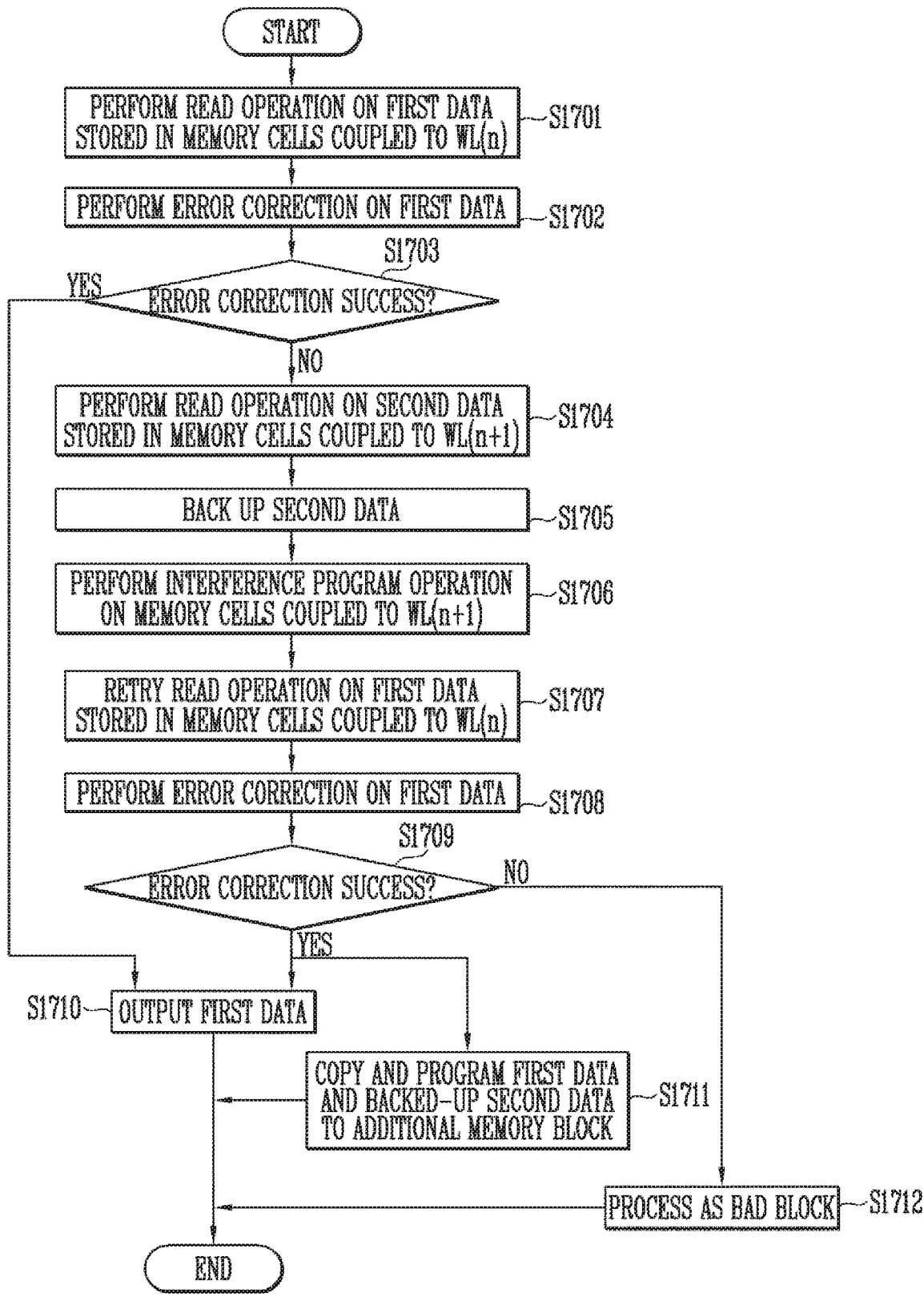
FIG. 17 is a flowchart describing a read operation according to an embodiment of the present disclosure.

FIG. 17 is a flowchart describing a read operation according to an embodiment of the present disclosure.

Referring to FIG. 17, a read operation may be performed on first data stored in memory cells coupled to WL(n) at step S1701. Step S1701 may be controlled by a control logic 300, and may be performed using a read voltage generated by a voltage generation circuit 210. Further, data read at step S1701 may be stored in a page buffer group 230.

Next, an error correction operation may be performed on the first data at step S1702. Step S1702 may be performed by the ECC unit 730 of a memory controller 1200.

When error correction fails ("No" at step S1703), the operation of reading second data stored in memory cells coupled to WL(n+1) may be performed at step S1704.

Next, a memory system 1000 may back up the second data at step S1705. Step S1705 may be performed under the control of the control logic 300 of a nonvolatile memory device 1100 in response to a command from the memory controller 1200. The second data may be programmed and backed up to an additional memory block 110.

After step S1705, an interference program operation may be performed on memory cells coupled to WL(n+1) at step S1706. Step S1706 may be performed under the control of the control logic 300 of the nonvolatile memory device 1100 in response to the command from the memory controller 1200.

After step S1706, a read operation on the first data stored in the memory cells coupled to WL(n) may be retried at step S1707. Step S1707 may be performed under the control of the control logic 300 of the nonvolatile memory device 1100 in response to the command from the memory controller 1200.

An error correction operation may be performed on the first data, which is read at step S1707, at step S1708. Step S1708 may be performed by the ECC unit 730 of the memory controller 1200.

Here, when error correction succeeds ("Yes" at step S1709), the memory system 1000 may output the first data to a host 2000 at step S1710.

Further, when the error correction succeeds, the memory system 1000 may copy and program the first data and the backed-up second data to an additional memory block at step S1711.

When error correction fails at step S1709 ('No' at step S1709), the memory system 1000 may process the corresponding memory block 110 as a bad block.

When error correction succeeds at step S1703 ("Yes" at step S1703), step S1710 may be immediately performed, and the read operation may be terminated.

Through the above-described operations, respective widths of threshold voltage distributions of the memory cells coupled to WL(n) may be decreased, and then the read operation may be successfully performed. Consequently, the reliability of the memory system 1000 may be improved.

Figure 18:
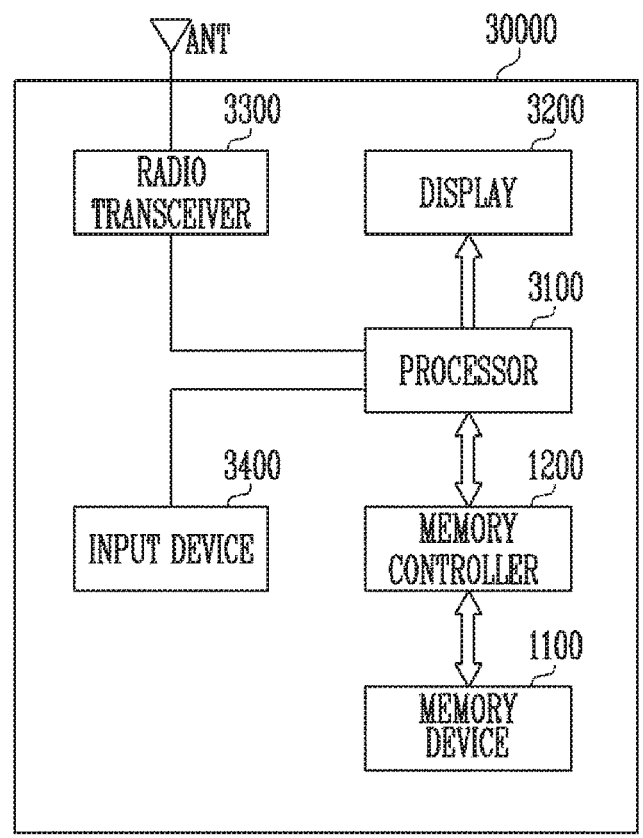
FIGS. 18 to 21 are diagrams illustrating application examples of a memory system including the memory device of FIG. 3.

FIG. 18 is a diagram illustrating an application example of a memory system including the memory device of FIG. 3. For example, the memory system 30000 shown in FIG. 18 may correspond to the memory system 1000 of FIG. 1. Including the memory device 1100 of FIG. 3.

Referring to FIG. 18, a memory system 30000 may be embodied in a cellular phone, a smartphone, a tablet PC, a personal digital assistant (PDA) or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be output through a display 3200 under the control of the memory controller 1200.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 1200, data output from the radio transceiver 3300, or data output from the input device 3400 is output through the display 3200.

In an embodiment, the memory controller 1200 capable of controlling the operation of the memory device 1100 may be implemented as a part of the processor 3100 or a chip provided separately from the processor 3100.

Figure 19:
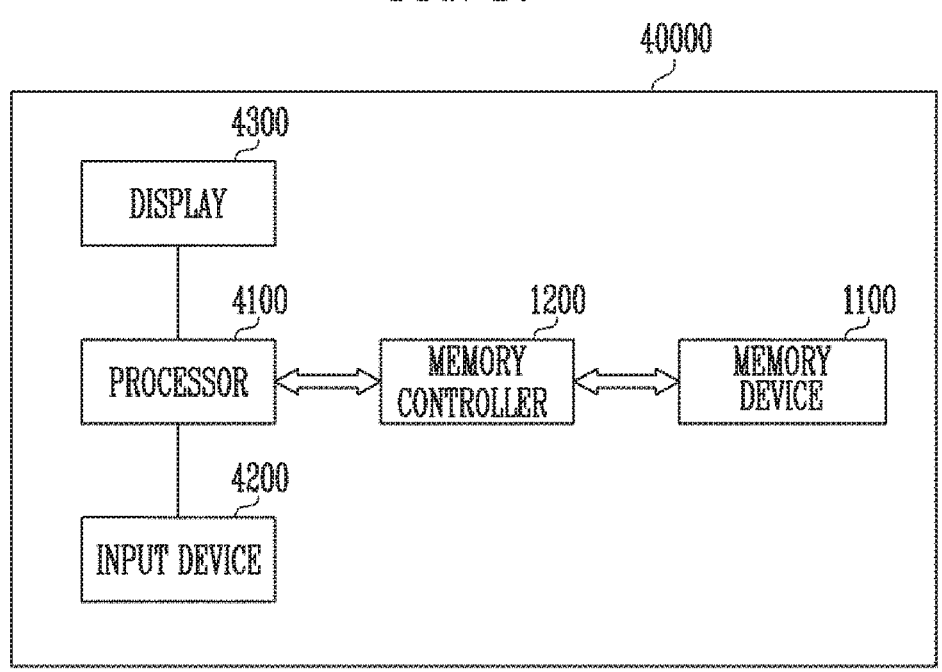

FIG. 19 is a diagram illustrating an application example of a memory system including the memory device of FIG. 3. For example, the memory system 40000 shown in FIG. 19 may correspond to the memory system 1000 of FIG. 1. Including the memory device 1100 of FIG. 3.

Referring to FIG. 19, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data input from an input device 4200. For example, the input device 4200 may be implemented as a point device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 20:
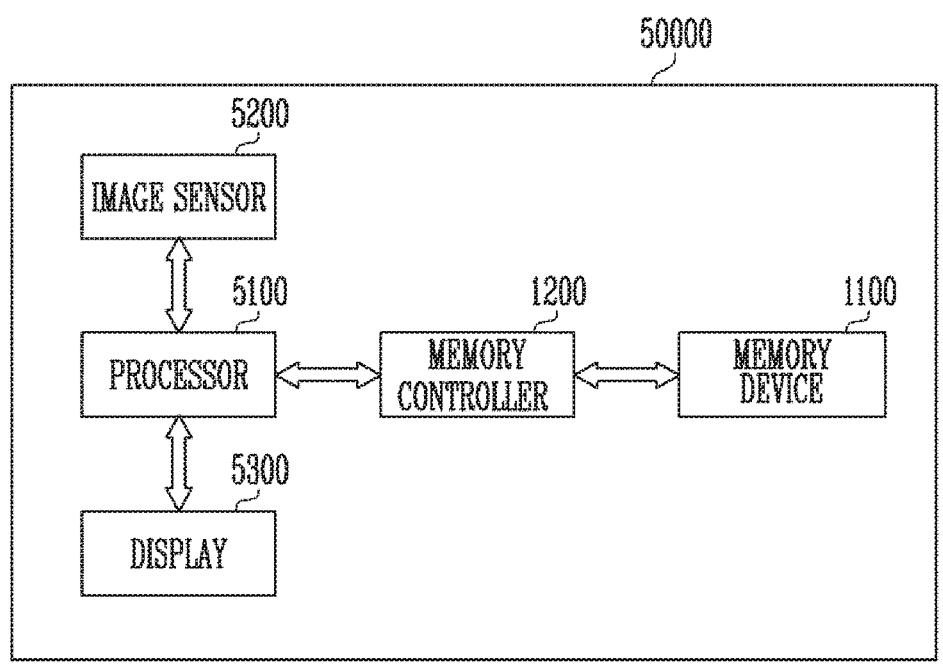

FIG. 20 is a diagram illustrating an application example of a memory system including the memory device of FIG. 3. For example, the memory system 50000 shown in FIG. 20 may correspond to the memory system 1000 of FIG. 1. Including the memory device 1100 of FIG. 3.

Referring to FIG. 20, a memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be output through a display 5300 or stored in the memory device 1100 through the memory controller 1200. Data stored in the memory device 1100 may be output through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100.

Figure 21:
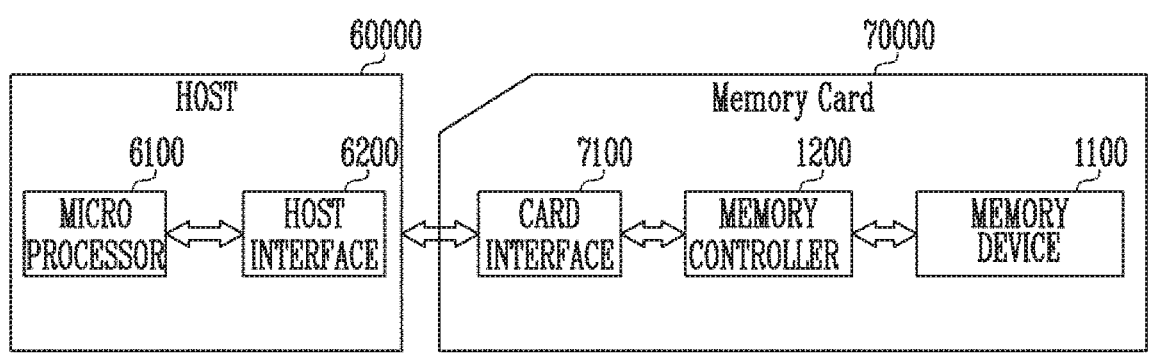

FIG. 21 is a diagram illustrating an application example of a memory system including the memory device of FIG. 3. For example, the memory system 70000 shown in FIG. 21 may correspond to the memory system 1000 of FIG. 1. Including the memory device 1100 of FIG. 3.

Referring to FIG. 21, a memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

The present disclosure may improve the reliability of a memory system by performing an interference program operation on adjacent memory cells so as to improve a threshold voltage distribution of memory cells during a read operation of the memory system.

Various embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a memory system, comprising:
performing a first read operation on first data stored in first memory cells coupled to a first word line;
performing an error correction operation on the first data;
performing an interference program operation on second memory cells coupled to a second word line in response to failure of the error correction operation; and
performing a second read operation on the first data stored in the first memory cells after performing the interference program operation,
wherein the interference program operation is configured to increase threshold voltages of memory cells in an erase threshold voltage distribution by a first threshold voltage, and increase threshold voltages of memory cells in a second program threshold voltage distribution by a second threshold voltage, and
wherein the first threshold voltage is greater than the second threshold voltage.

2. The method according to claim 1, wherein the second word line is adjacent to the first word line.

3. The method according to claim 2, wherein:
stored data in each of the first and second memory cells includes a least significant bit (LSB) and a most significant bit (MSB), and
an MSB program operation is performed on the second memory cells after an MSB program operation has been performed on the first memory cells.

4. The method according to claim 2, further comprising, before performing the interference program operation,
reading second data stored in the second memory cells; and
backing up the second data.

5. The method according to claim 4, further comprising copying and programming the first data and the second data to another location.

6. The method according to claim 2, wherein:
threshold voltages of the second memory cells form the erase threshold voltage distribution, a first program threshold voltage distribution, the second program threshold voltage distribution, and a third program threshold voltage distribution in ascending order of magnitudes of their threshold voltages.

7. The method according to claim 6, wherein:
the interference program operation is configured to increase threshold voltages of memory cells in the third program threshold voltage distribution by a third threshold voltage, and
the second threshold voltage is greater than the third threshold voltage.

8. The method according to claim 6, wherein, during the interference program operation, memory cells in the first program threshold voltage distribution are program-inhibited.

9. The method according to claim 6, wherein read voltages used in performing the second read operation are greater than respective read voltages used in performing the first read operation.

10. The method according to claim 2, wherein the interference program operation causes respective widths of program threshold voltage distributions of the first memory cells to decrease.

11. A method of operating a memory device, comprising:
performing a first read operation on first data stored in first memory cells coupled to a first word line;
performing a read operation on second data stored in second memory cells coupled to a second word line that is adjacent to the first word line;
performing an interference program operation on the second memory cells; and
performing a second read operation on the first data stored in the first memory cells after performing the interference program operation,
wherein the interference program operation causes widths of one or more of program threshold voltage distributions formed by the first memory cells to decrease, and
wherein the performing the interference program operation comprises:
applying a first program bias to the second word line; and
applying a second program bias greater than the first program bias to the second word line.

12. The method according to claim 11, further comprising:
storing the second data in a page buffer group;
changing data corresponding to an erase threshold voltage distribution, of the second data stored in the page buffer group, to data corresponding to a first program threshold voltage distribution; and
changing data corresponding to a second program threshold voltage distribution, of the second data stored in the page buffer group, to data corresponding to a third program threshold voltage distribution,
wherein threshold voltages of the second memory cells form the erase threshold voltage distribution, the first program threshold voltage distribution, the second program threshold voltage distribution, and the third program threshold voltage distribution in ascending order of magnitudes of their threshold voltages.

13. The method according to claim 12, wherein the interference program operation is performed based on the changed data.

14. The method according to claim 11, wherein:
during the applying of the second program bias, memory cells corresponding to the erase threshold voltage distribution or the first program threshold voltage distribution are program-inhibited, and
threshold voltages of the second memory cells form the erase threshold voltage distribution, the first program threshold voltage distribution, the second program threshold voltage distribution, and the third program threshold voltage distribution in ascending order of magnitudes of their threshold voltages.

15. The method according to claim 11, further comprising programming the first data to the first memory cells and programming the second data to the second memory cells, and
wherein the programming is performed based on a shadow program algorithm.

16. A memory system, comprising:
a first physical page configured to store data;
a second physical page arranged adjacent to the first physical page;
a control logic configured to control a read operation and a program operation on the first and second physical pages; and
an error checking and correction unit configured to perform an error correction operation on data read from the first and second physical pages,
wherein, in response to failure of the error checking and correction unit in an error correction operation performed on data read from the first physical page, the control logic performs a program operation on the second physical page, and
wherein the program operation is configured to shift threshold voltages of memory cells in an erase threshold voltage distribution to a first program threshold voltage distribution.

17. The memory system according to claim 16, wherein the control logic performs another read operation on the first physical page after performing the program operation on the second physical page.

18. The memory system according to claim 16, wherein:
threshold voltages of the second physical page form the erase threshold voltage distribution, the first program threshold voltage distribution, a second program threshold voltage distribution, and a third program threshold voltage distribution in ascending order of magnitudes of their threshold voltages.

19. The memory system according to claim 18, wherein the program operation performed on the second physical page causes threshold voltages of memory cells in the second program threshold voltage distribution and memory cells in the third program threshold voltage distribution to be shifted to a fourth program threshold voltage distribution having threshold voltages greater than those of the third program threshold voltage distribution.

20. The memory system according to claim 18, wherein the control logic is configured such that, during the program operation, memory cells in the first program threshold voltage distribution are program-inhibited.

* * * * *